(12) United States Patent
Oomura

(10) Patent No.: US 12,114,575 B2
(45) Date of Patent: Oct. 8, 2024

(54) SENSOR ELECTRIC WIRE AND SENSOR CIRCUIT

(71) Applicant: ROBOSENSOR TECHNOLOGY RESEARCH, INC., Hamamatsu (JP)

(72) Inventor: Masayoshi Oomura, Hamamatsu (JP)

(73) Assignee: ROBOSENSOR TECHNOLOGY RESEARCH, INC., Hamamatsu (JP)

( * ) Notice: Subject to any disclaimer, the term of this patent is extended or adjusted under 35 U.S.C. 154(b) by 910 days.

(21) Appl. No.: 17/255,230

(22) PCT Filed: Oct. 29, 2018

(86) PCT No.: PCT/JP2018/040098
§ 371 (c)(1),
(2) Date: Dec. 22, 2020

(87) PCT Pub. No.: WO2020/089965
PCT Pub. Date: May 7, 2020

(65) Prior Publication Data
US 2021/0119107 A1   Apr. 22, 2021

(51) Int. Cl.
*H01L 41/087* (2006.01)
*G01L 1/16* (2006.01)
*H10N 30/60* (2023.01)

(52) U.S. Cl.
CPC ............... *H10N 30/60* (2023.02); *G01L 1/16* (2013.01)

(58) Field of Classification Search
CPC .................................. G01L 1/16; H10N 30/60
See application file for complete search history.

(56) References Cited

U.S. PATENT DOCUMENTS

| 3,750,127 | A | 7/1973 | Ayers et al. |
| 4,183,010 | A | 1/1980 | Miller |
| 2008/0255435 | A1* | 10/2008 | Al-Ali ............... H01B 11/1091 600/323 |
| 2011/0237953 | A1* | 9/2011 | Olsson ................. A61B 8/4483 600/459 |
| 2018/0325384 | A1* | 11/2018 | Agarwal ............. H10N 30/098 |
| 2019/0032272 | A1* | 1/2019 | Liff ..................... H10N 30/8542 |
| 2019/0252596 | A1* | 8/2019 | Akimoto ............... H10N 30/60 |

(Continued)

FOREIGN PATENT DOCUMENTS

| GB | 807019 A | 1/1959 |
| JP | S50-17877 A | 2/1975 |
| JP | S62-230071 A | 10/1987 |

(Continued)

OTHER PUBLICATIONS

Oct. 3, 2022 Opposition issued in Japanese Patent No. 6996796.
(Continued)

*Primary Examiner* — Bryan P Gordon
(74) *Attorney, Agent, or Firm* — Oliff PLC

(57) ABSTRACT

A sensor electric wire that is not readily affected by external noise, and a sensor circuit that uses the same, including a first internal conductor covered by a piezoelectric material, a second internal conductor provided on the outside of the piezoelectric material, and an external shield conductor surrounding the first internal conductor and the second internal conductor, an insulating body being disposed between the first internal conductor and second internal conductor, and the external shield conductor.

2 Claims, 25 Drawing Sheets

(56) References Cited

U.S. PATENT DOCUMENTS

2021/0119107 A1\* 4/2021 Oomura .................... G06F 3/03
2021/0356349 A1\* 11/2021 Raymond ............. G01M 3/165

FOREIGN PATENT DOCUMENTS

JP      2005024385 A     1/2005
JP      2008-151638 A    7/2008

OTHER PUBLICATIONS

Apr. 27, 2021 International Preliminary Report on Patentability issued in International Patent Application No. PCT/JP2018/040098.
Nov. 20, 2018 Search Report issued in International Patent Application No. PCT/JP2018/040098.

\* cited by examiner

[Figure 1]
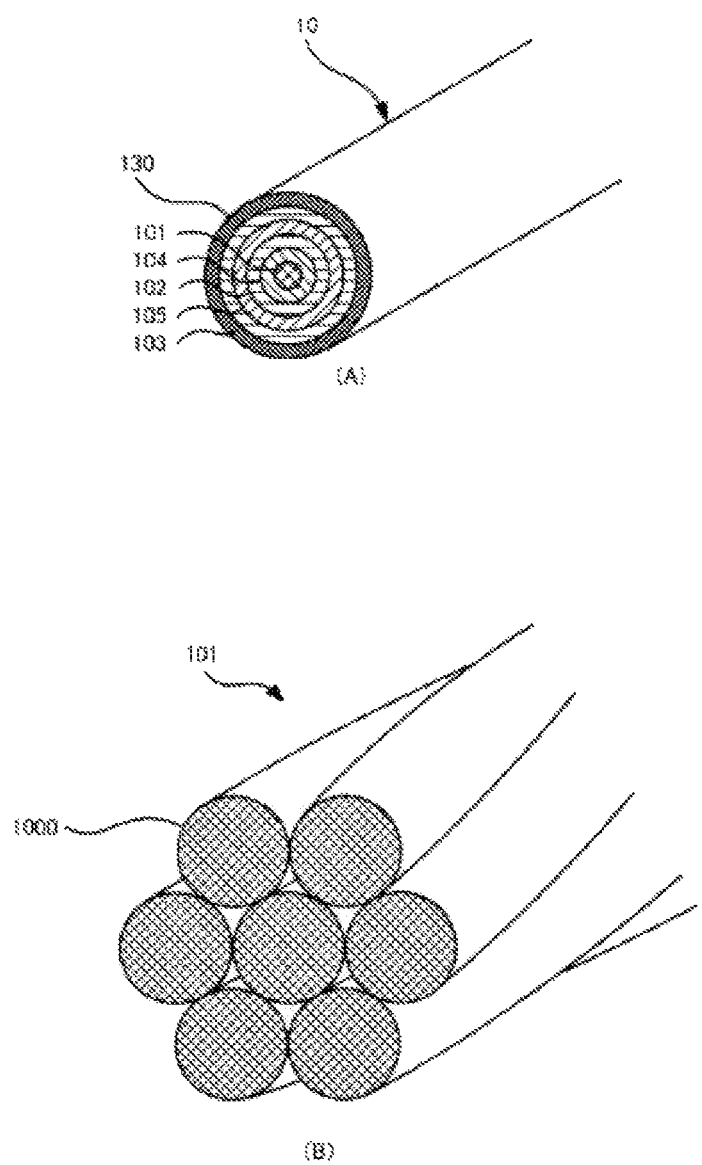

[Figure 2]
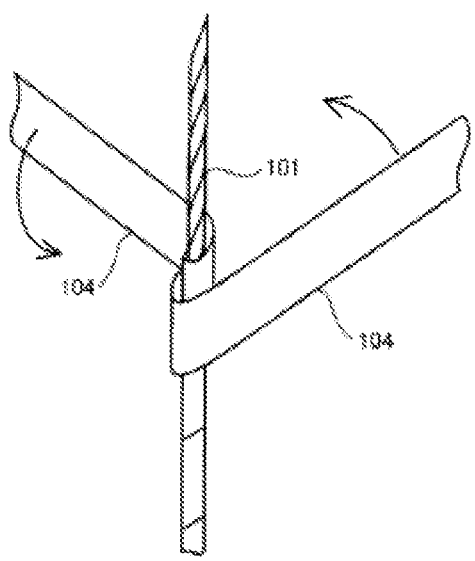

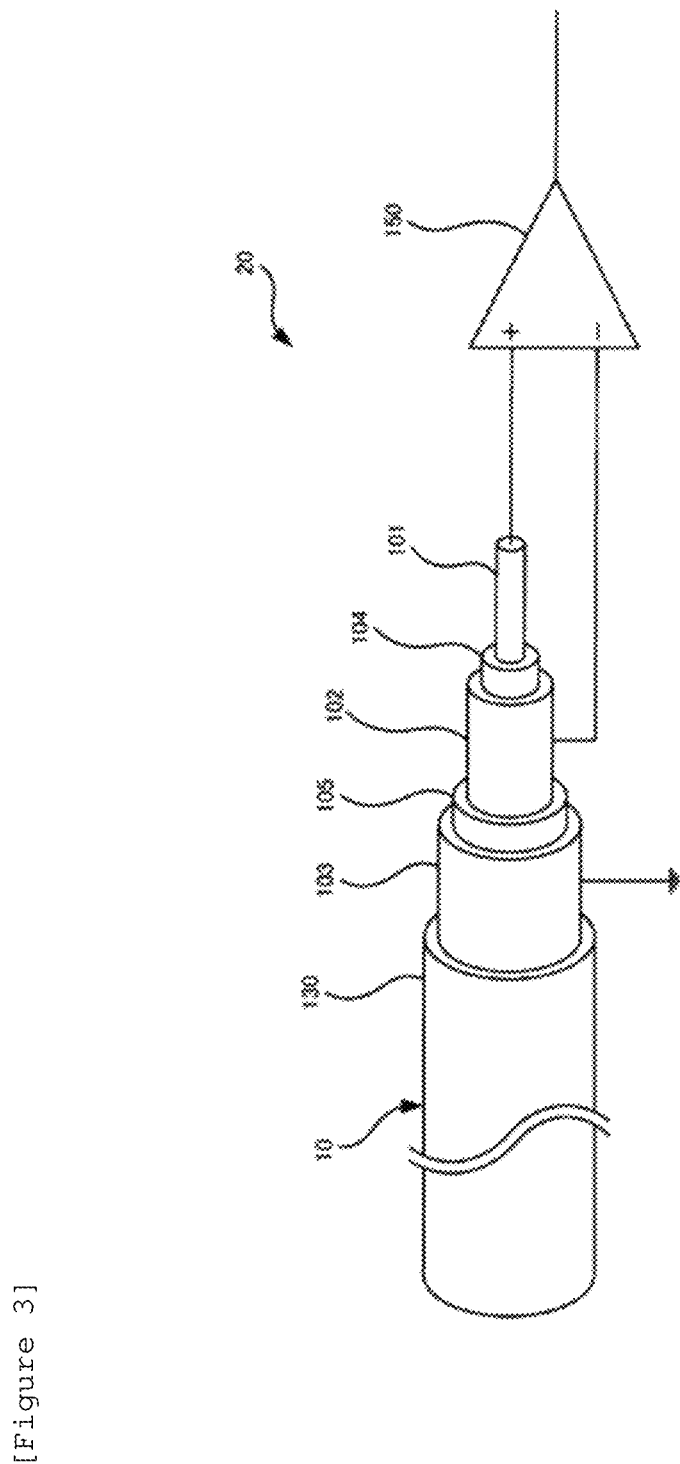
[Figure 3]

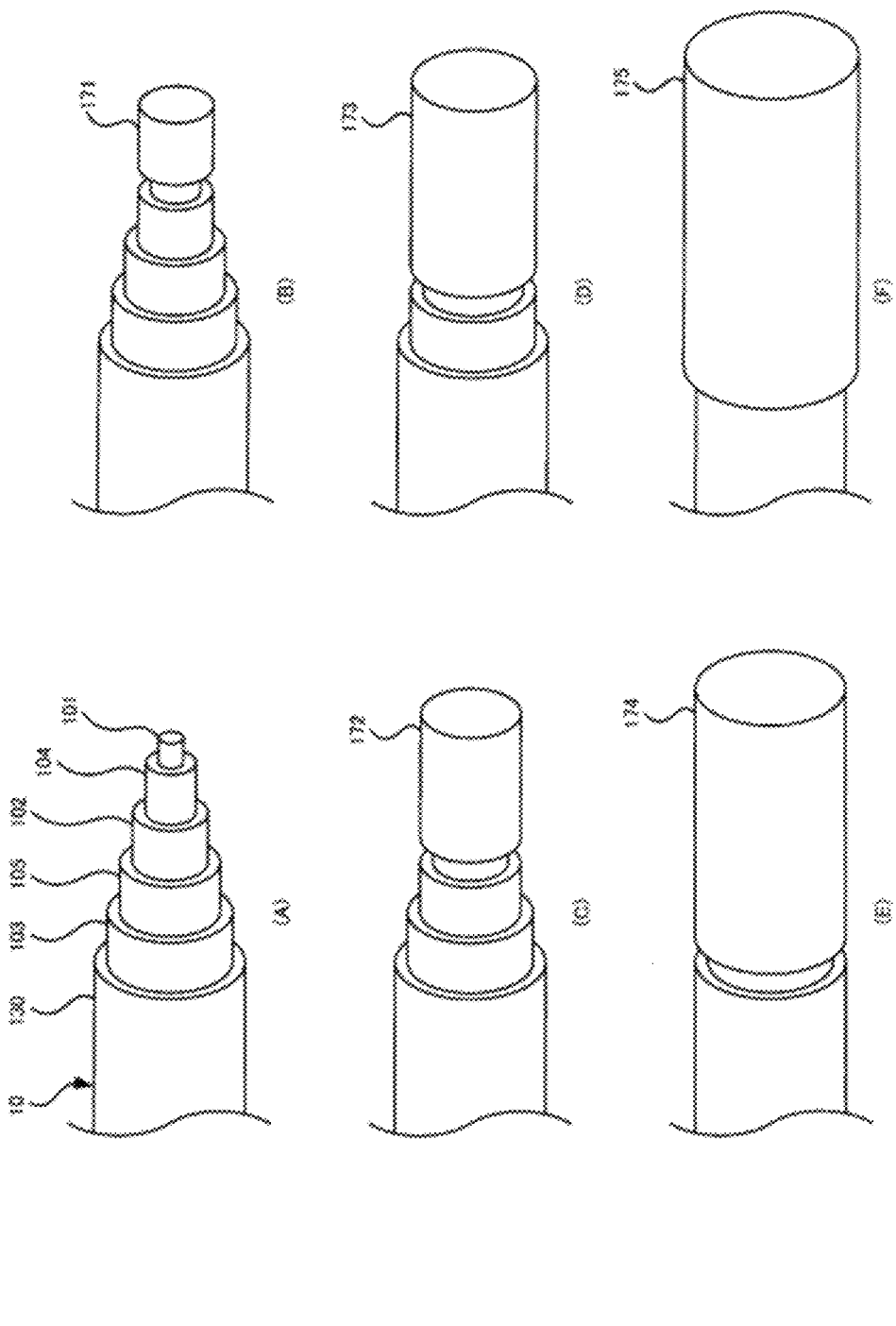
[Figure 4]

[Figure 5]
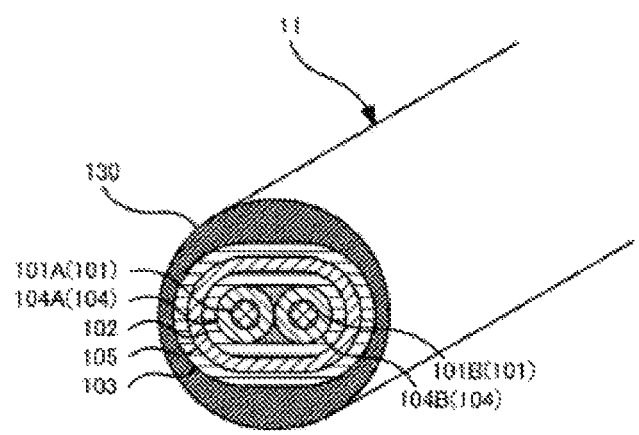

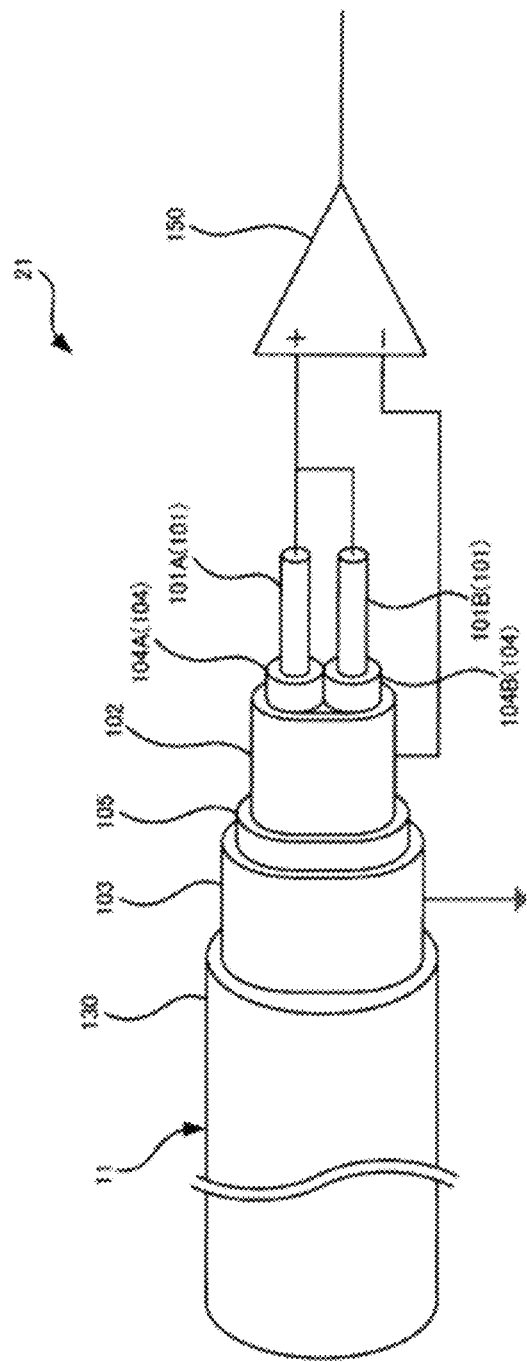
[Figure 6]

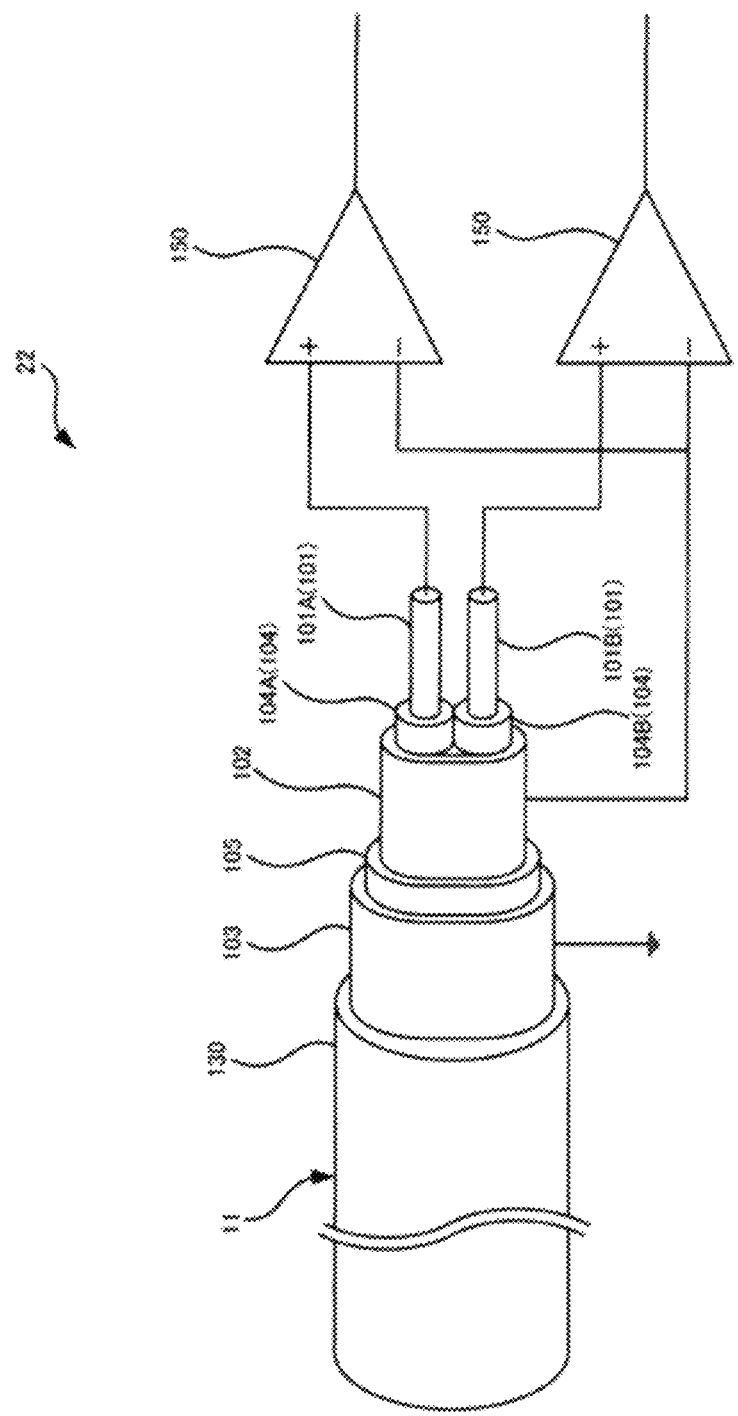
[Figure 7]

[Figure 8]
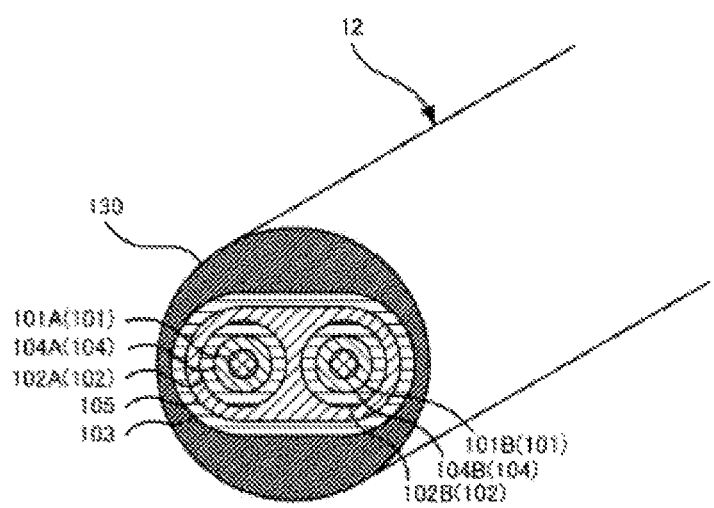

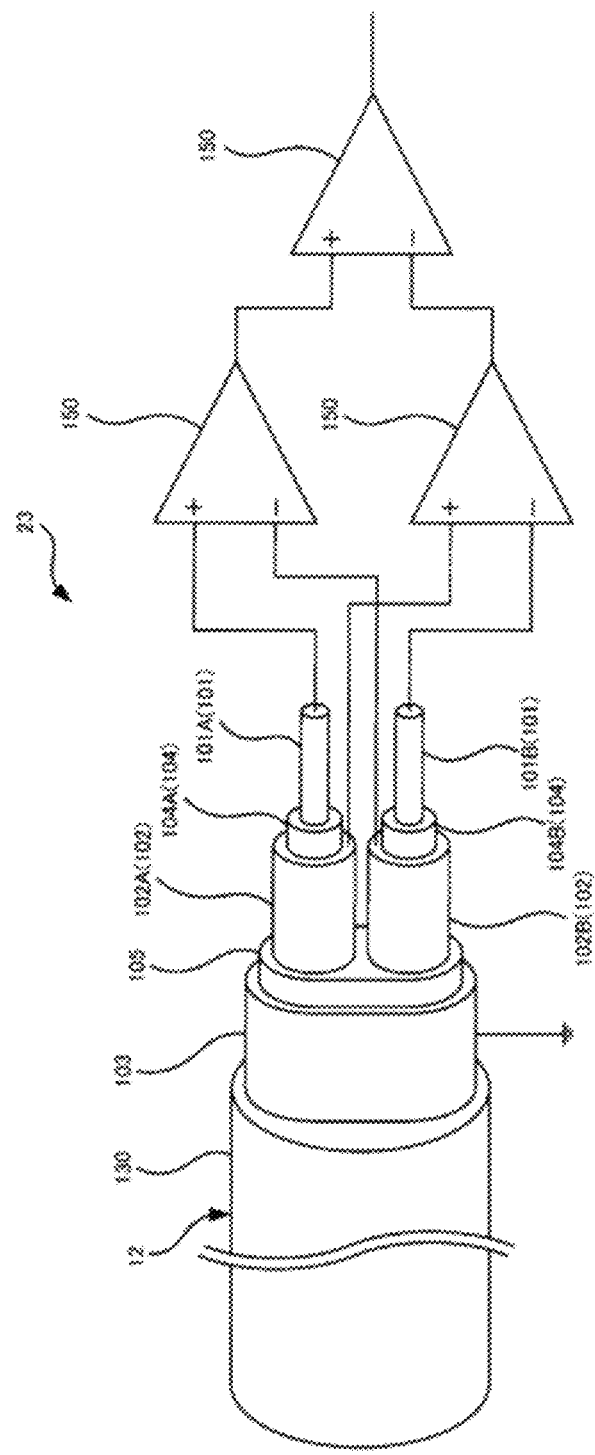
[Figure 9]

[Figure 10]
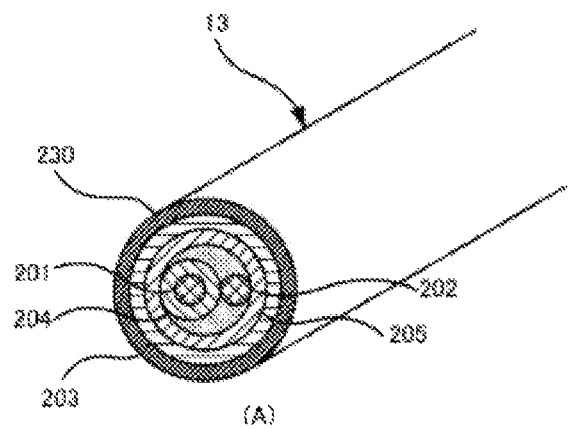
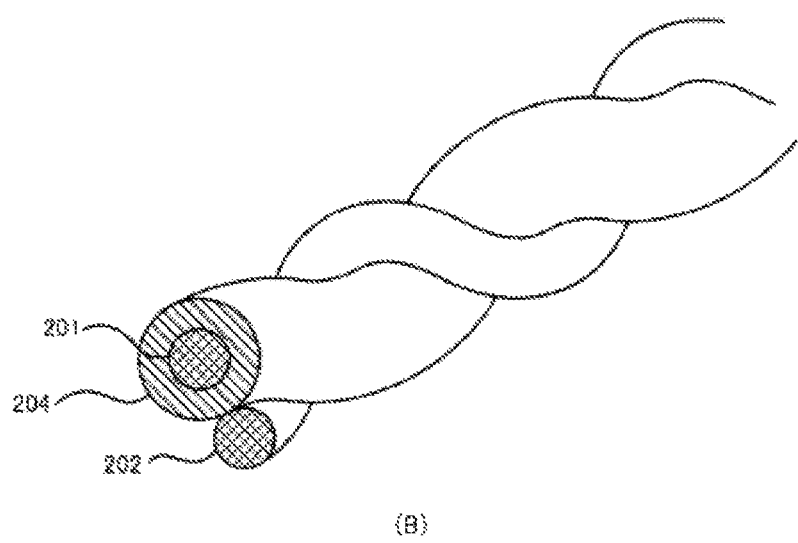

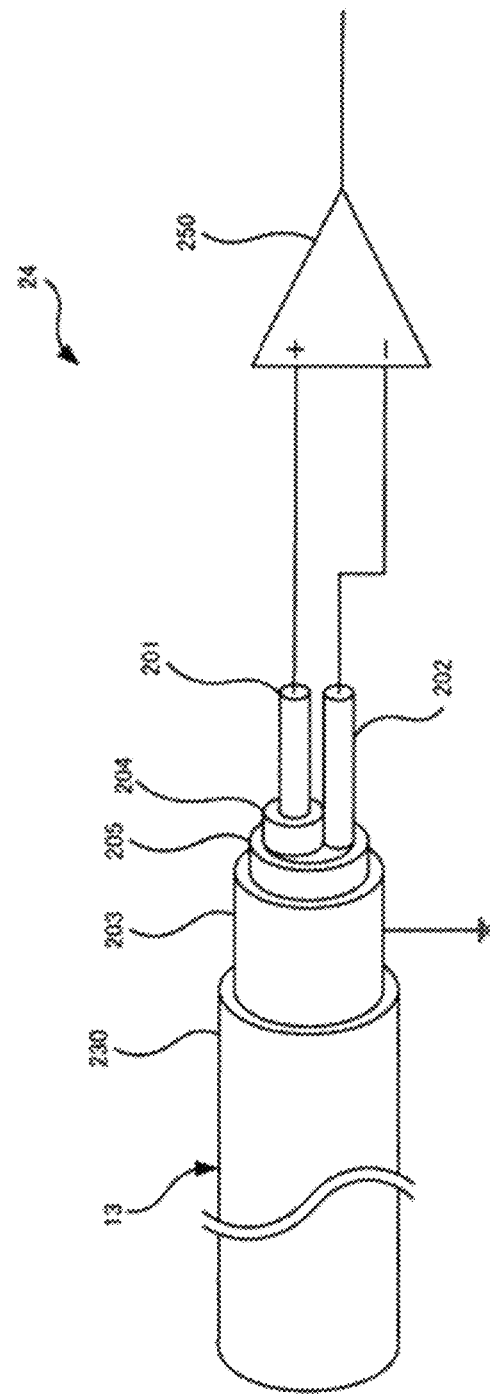
[Figure 11]

[Figure 12]
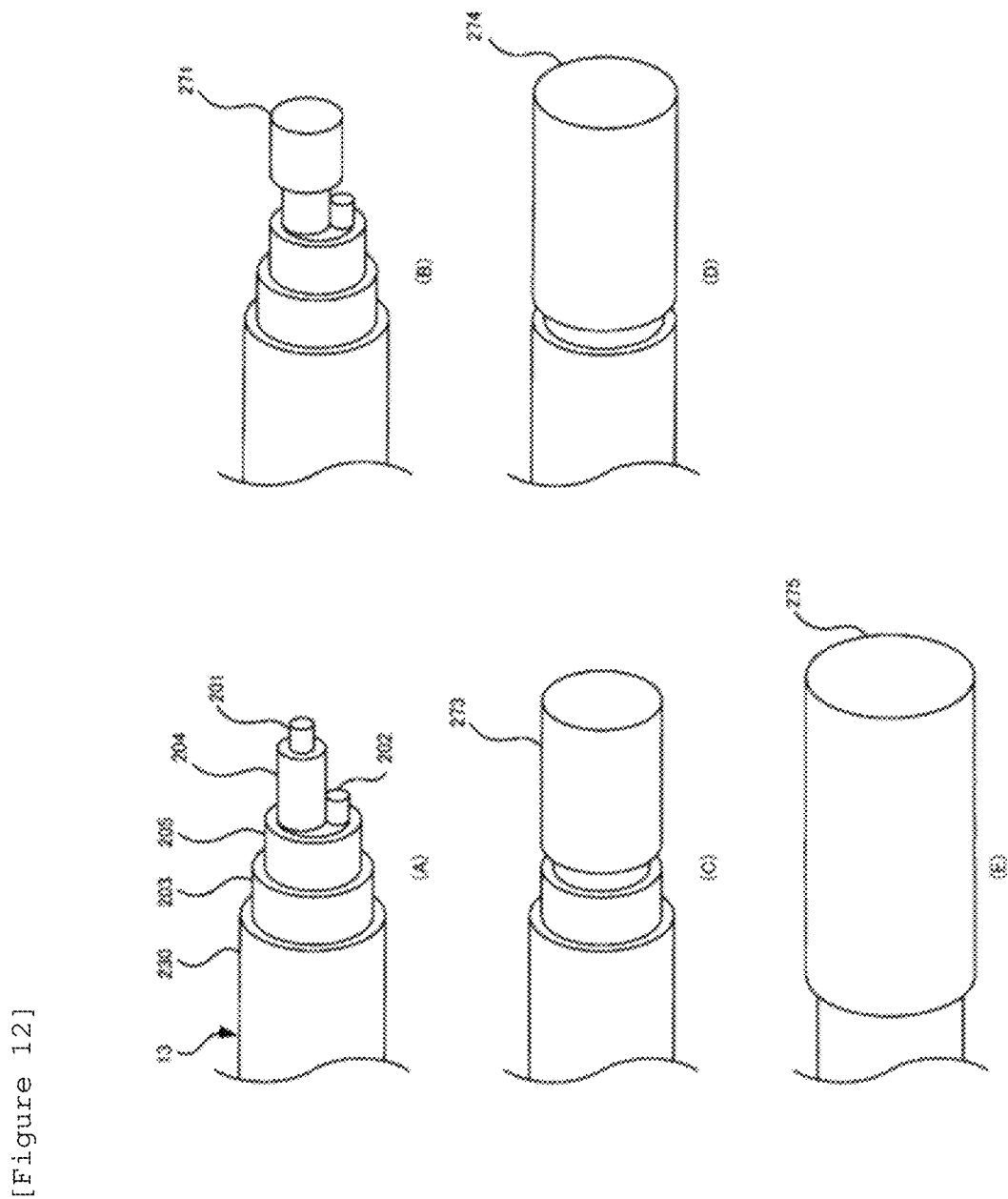

[Figure 13]
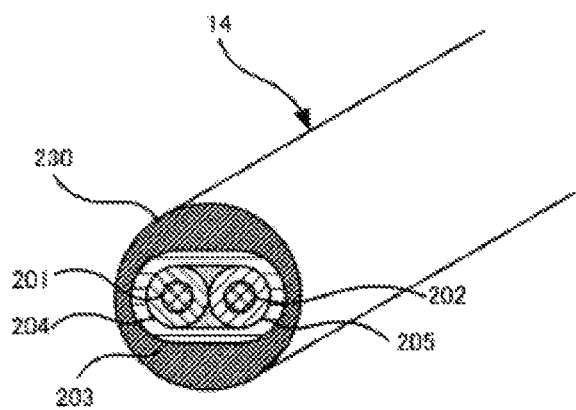

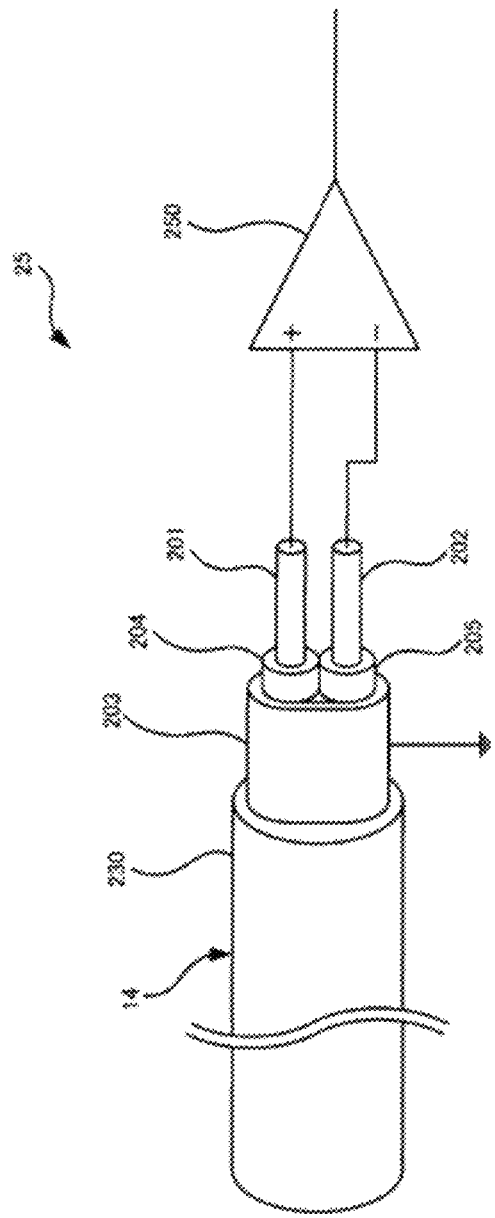
[Figure 14]

[Figure 15]
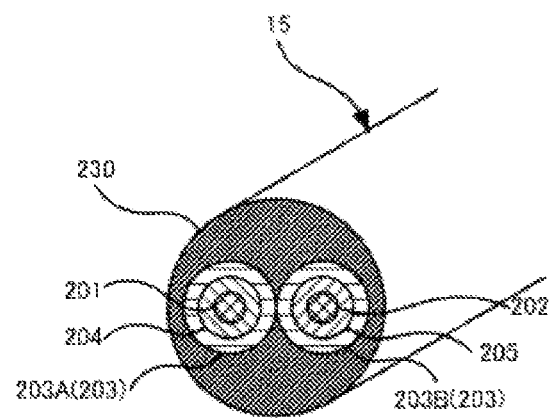

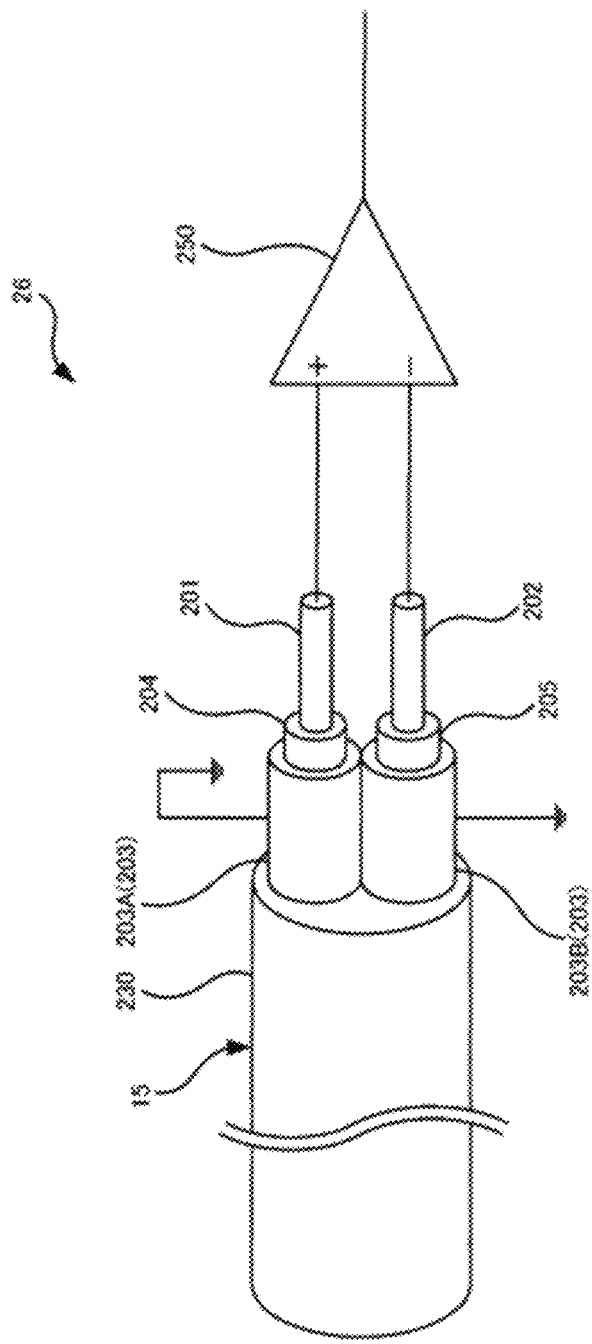
[Figure 16]

[Figure 17]
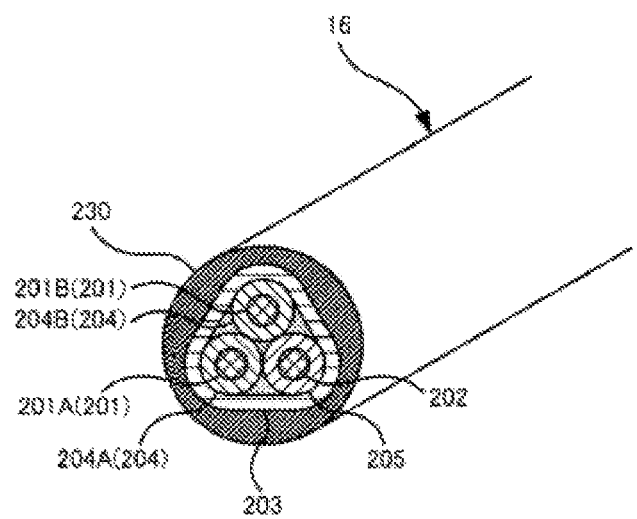

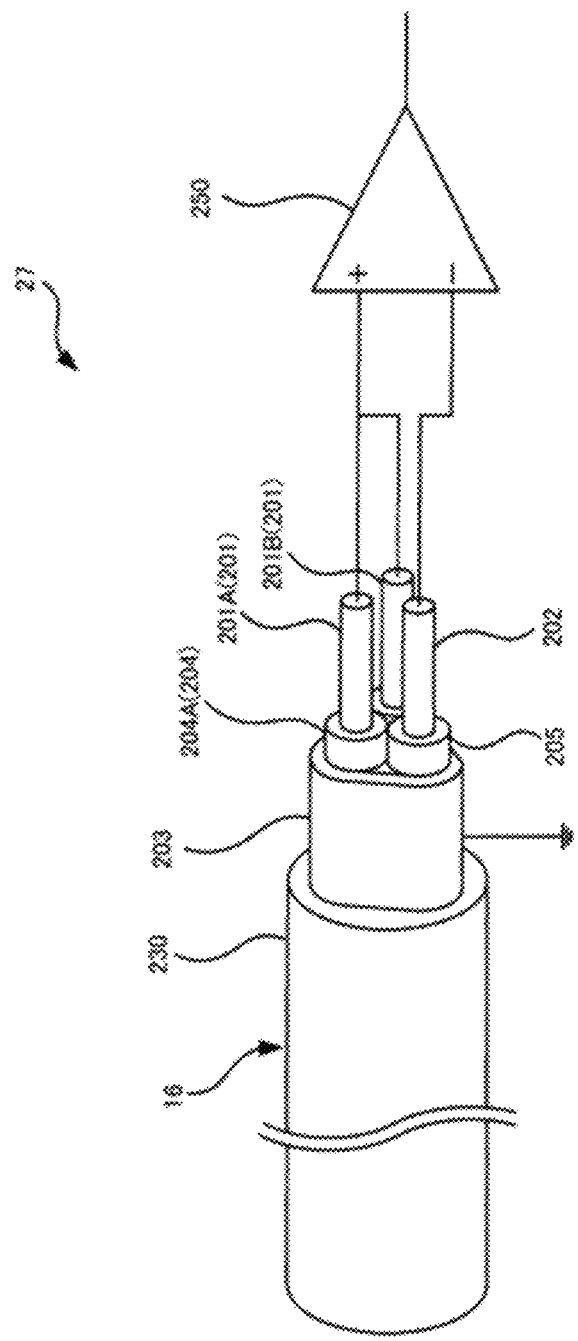
[Figure 18]

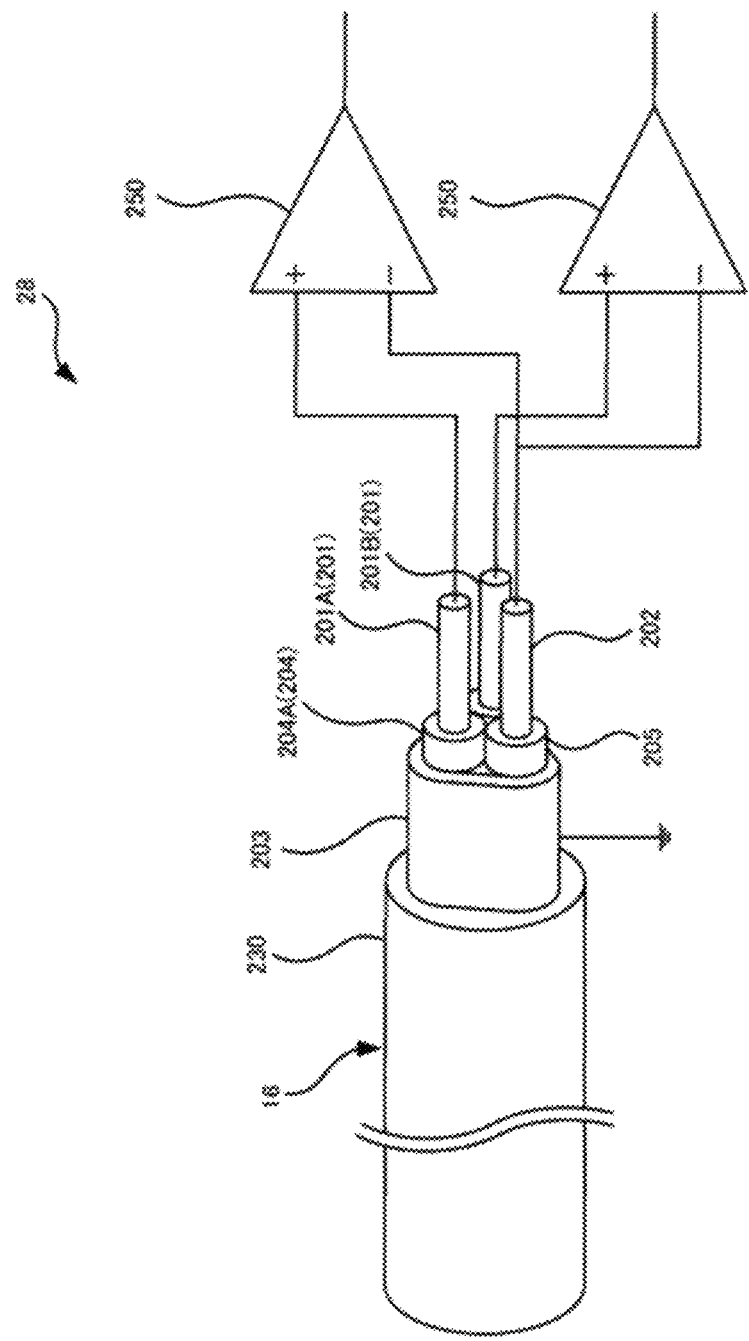
[Figure 19]

[Figure 20]
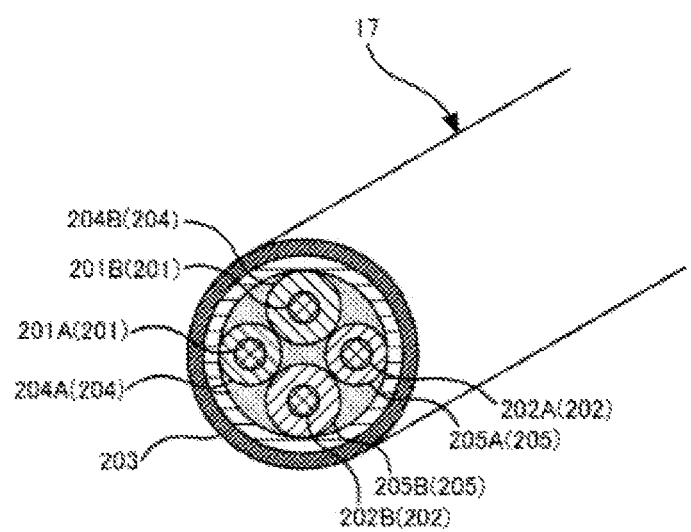

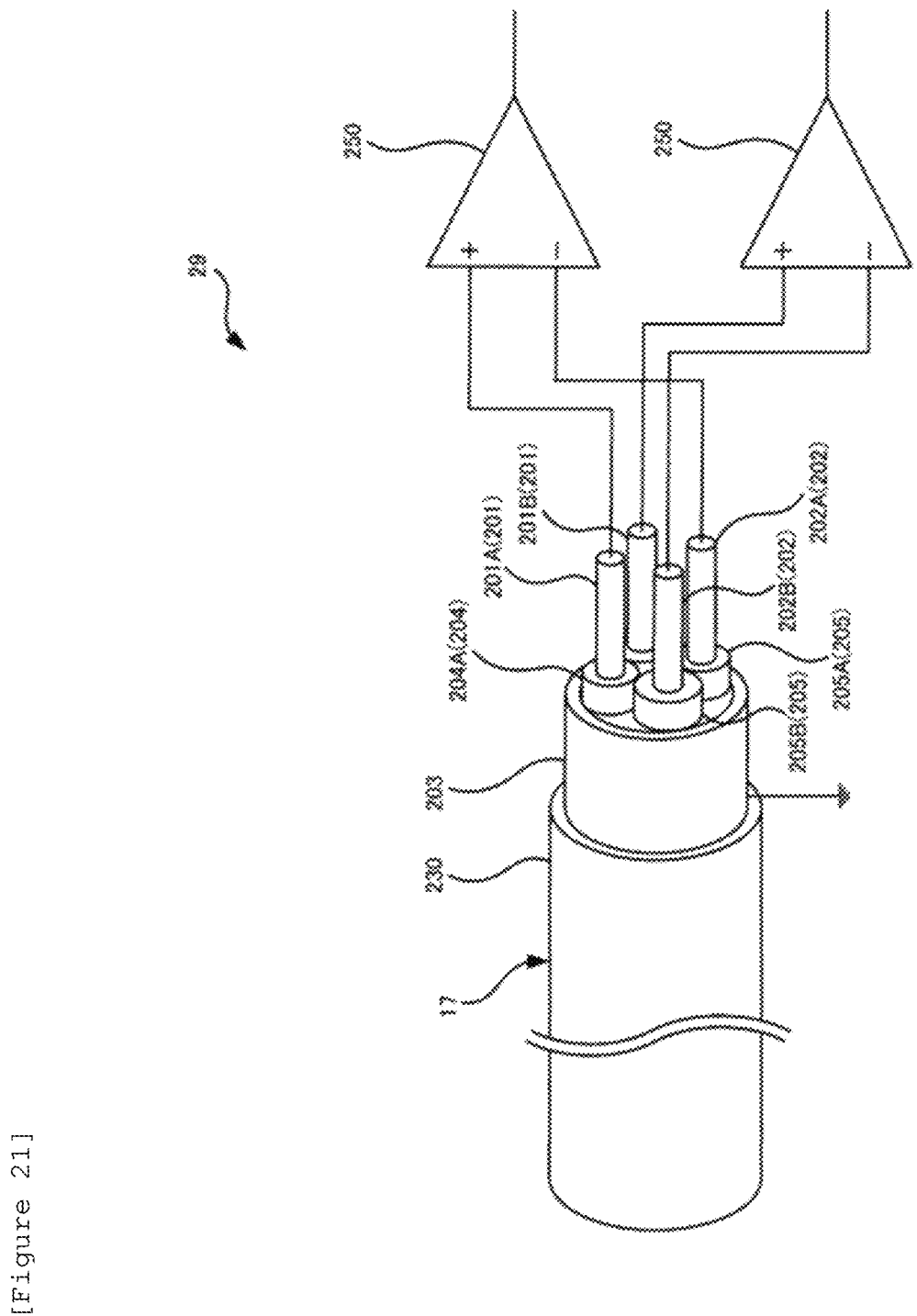
[Figure 21]

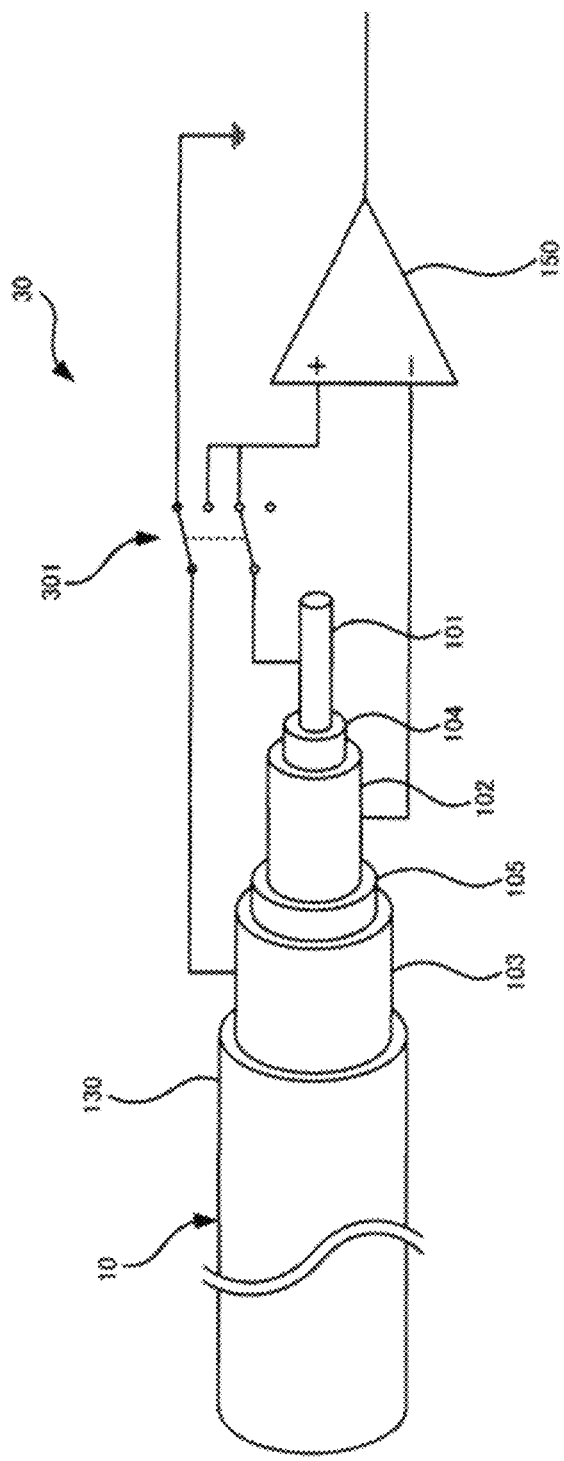
[Figure 22]

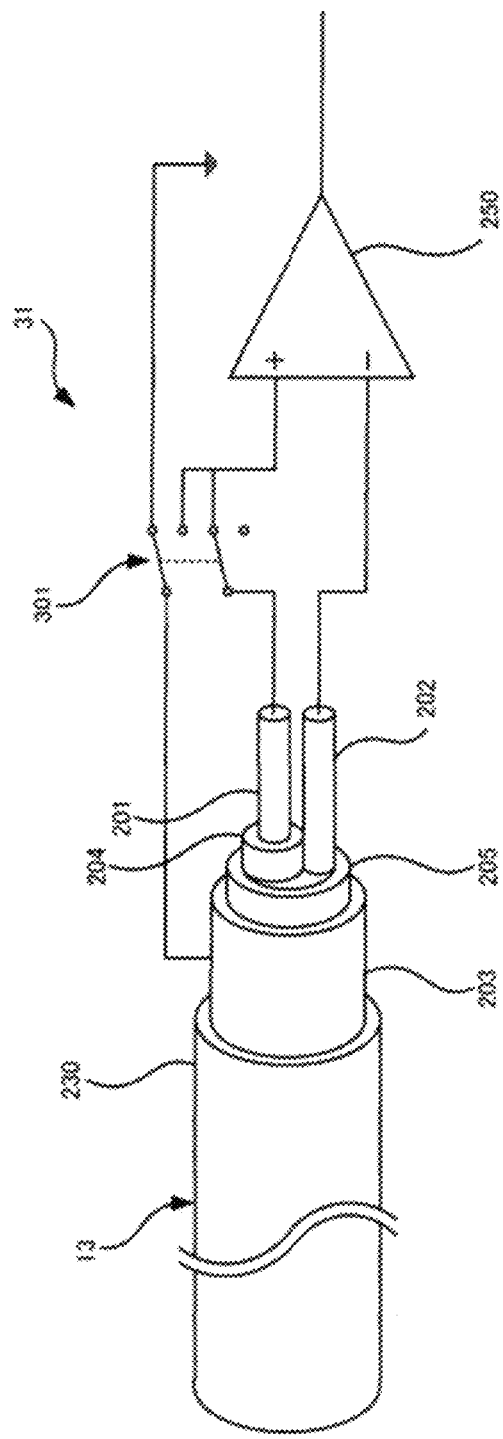
[Figure 23]

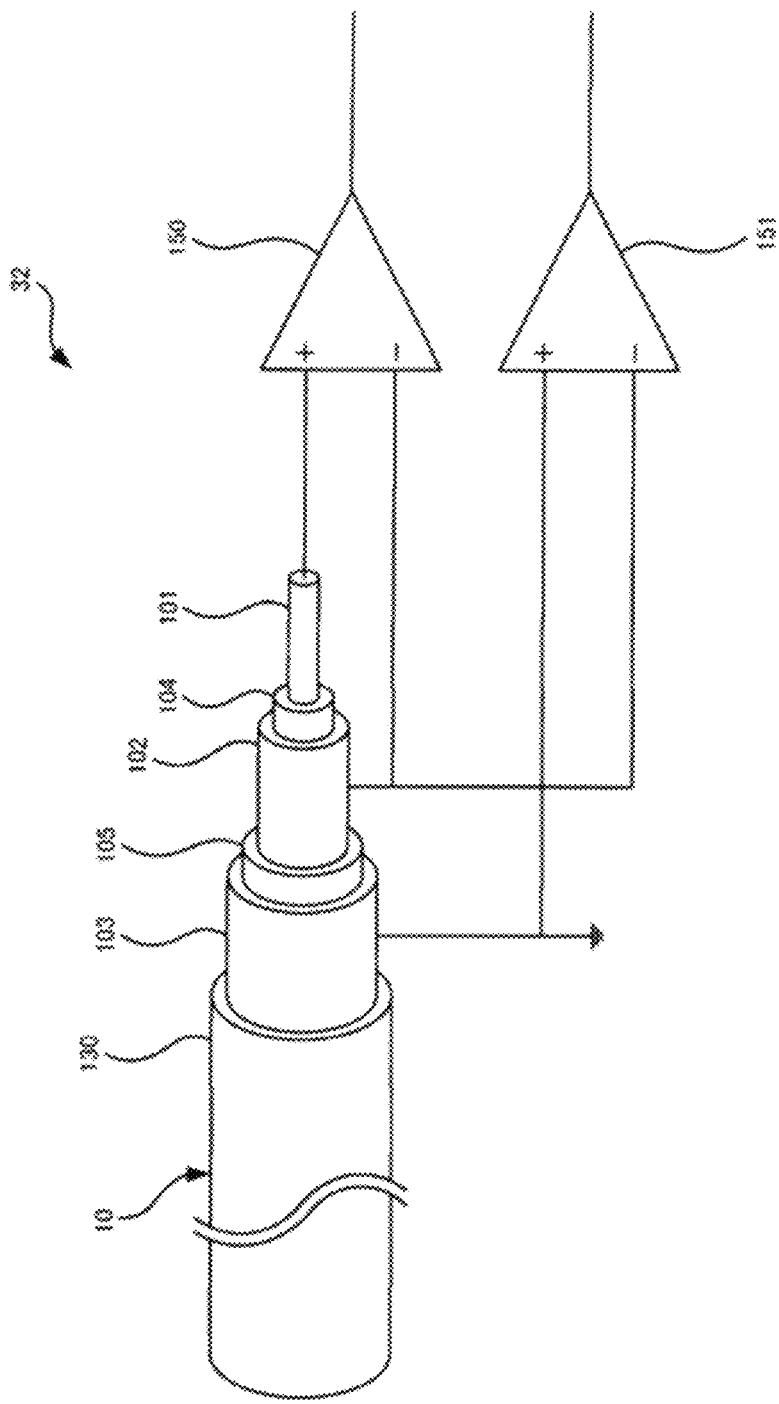
[Figure 24]

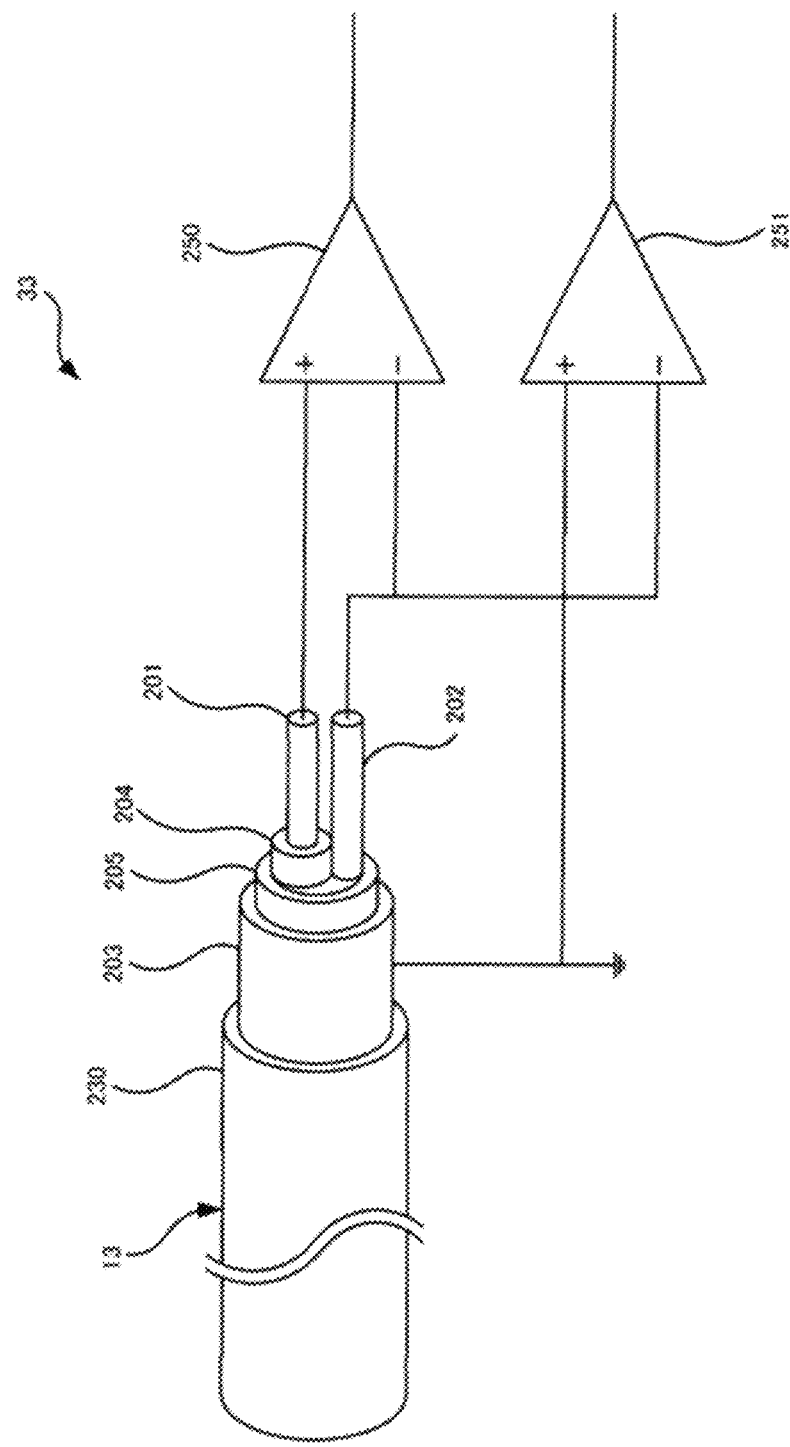
[Figure 25]

SENSOR ELECTRIC WIRE AND SENSOR CIRCUIT

TECHNICAL FIELD

The present invention relates to a sensor electric wire using a piezoelectric material and a sensor circuit using the sensor electric wire.

BACKGROUND ART

In the related art, a sensor electric wire using a piezoelectric material is known (for example, refer to Patent Literature 1). When the sensor electric wire is deformed by a force, a voltage is induced between an internal conductor and an external conductor. This characteristic can be used for a tactile sensor, a vibration sensor, and the like.

CITATION LIST

Patent Literature

Patent Literature 1: Japanese Patent Laid-Open No. 2008-151638

SUMMARY OF INVENTION

Technical Problem

Since the sensor electric wire of Patent Literature 1 is likely to be affected by external noise, reliability of a sensor may decrease.

In view of the above circumstance, an object of the invention is to provide a sensor electric wire that is not likely to be affected by external noise, and a sensor circuit using the sensor electric wire.

Solution to Problem

According to an aspect of the invention, a sensor electric wire includes:
a first internal conductor covered with a piezoelectric material;
a second internal conductor provided on an external side of the piezoelectric material; and
an external shield conductor surrounding the first internal conductor and the second internal conductor.

Insulators are arranged between the first internal conductor, the second internal conductor, and the external shield conductor.

According to the sensor electric wire, noise is prevented from entering the external shield conductor, and by using a potential difference between the first internal conductor and the second internal conductor, influence of external noise during detection of an induced voltage due to an external force can be reduced.

Here, in the sensor electric wire described above,
the second internal conductor may cover an external periphery of the piezoelectric material.

There may be a gap in the second internal conductor covering the piezoelectric material when, for example, the second internal conductor is mesh-shaped. That is, the "cover" as used herein is not limited to completely covering the external periphery of the piezoelectric material, and there may also be a gap within a range thereof.

In the sensor electric wire described above,
the second internal conductor may constitute a core different from that of the first internal conductor, and
the first internal conductor and the second internal conductor may be twisted together.

According to the sensor electric wire, it is possible to reduce fluctuations of potentials of the first internal conductor and the second internal conductor caused by the external noise, and to reduce the influence of the external noise during the detection of the induced voltage due to the external force.

The sensor electric wire may further include:
a plurality of first internal conductors.

One of the plurality of first internal conductors may have a different piezoelectric material or may have a piezoelectric material of different thickness from that of another first internal conductor.

According to the sensor electric wire, the induced voltage due to the external force can be increased and a dynamic range can be widened.

In the sensor electric wire described above,
a sheath is provided to cover an external periphery of the sensor electric wire.

At one end of the sensor electric wire, an external side of ends of the first internal conductor and the second internal conductor is surrounded by the external shield conductor or a conductor having the same potential as the external shield conductor.

The one end of the sensor electric wire may be covered with a cover member up to an end of the sheath.

According to the sensor electric wire, it is possible to make the sensor electric wire less susceptible to the noise at an end which is not used for connection with outside.

According to another aspect of the invention, a sensor circuit includes:
the sensor electric wire according to the above aspect; and
a first differential amplifier in which the first internal conductor and the second internal conductor are respectively connected to different input ends thereof so that a potential difference between these input ends is amplified and then output.

The external shield conductor is connected to a ground.

The sensor circuit can prevent the noise from entering by using the external shield conductor, reduce the influence of the external noise by using the differential amplifier to amplify and then output the potential difference between the first internal conductor and the second internal conductor, and can be used as a sensor that outputs a voltage corresponding to the external force.

The sensor circuit described above may further include:
a switching circuit that switches to a state where the external shield conductor is disconnected from the ground and one of the input ends of the first differential amplifier is connected to the external shield conductor.

According to the sensor circuit, the sensor circuit may be effectively utilized in a state where no external force is applied to the sensor electric wire.

The sensor circuit described above may further include:
a second differential amplifier in which one of the first internal conductor and the second internal conductor, and the external shield conductor are connected to different input ends of the second differential amplifier and a potential difference between these input ends is amplified and then output.

According to the sensor circuit, a degree of influence of the external noise can be determined by an output of the second differential amplifier, and it can be determined whether a signal from the first differential amplifier corresponds to the external force.

Advantageous Effect of Invention

The invention can provide a sensor electric wire that is less likely to be affected by external noise and a sensor circuit using the sensor electric wire.

BRIEF DESCRIPTION OF DRAWINGS

FIG. 1(A) is a cross-sectional view showing a structure of a sensor electric wire 10 according to a first embodiment of the invention, and FIG. 1(B) is a cross-sectional view showing a structure of a first internal conductor 101 of the sensor electric wire 10.

FIG. 2 is a view showing an example of how to wind a first insulating coating 104.

FIG. 3 is a view showing a sensor circuit 20 using the sensor electric wire 10 shown in FIG. 1.

FIGS. 4(A) to (F) are views showing an example in which an insulating member and a conductor member are applied to an end of the sensor electric wire 10 which is not connected to the circuit.

FIG. 5 is a cross-sectional view showing a structure of a sensor electric wire 11 including two first internal conductors 101 covered with the first insulating coating 104.

FIG. 6 is a view showing an example of a sensor circuit using the sensor electric wire 11 shown in FIG. 5.

FIG. 7 is a view showing an example of a sensor circuit using the sensor electric wire 11 shown in FIG. 5.

FIG. 8 is a cross-sectional view showing a structure of a sensor electric wire 12 including two combinations of the first insulating coating 104 covering the first internal conductor 101 and a second internal conductor 102 further covering an external side of the first insulating coating 104.

FIG. 9 is a view showing an example of a sensor circuit using the sensor electric wire 12 shown in FIG. 8.

FIG. 10(A) is a cross-sectional view showing a structure of a sensor electric wire 13 according to a second embodiment of the invention, and FIG. 10(B) is a view showing a state in which a first internal conductor 201 covered with a first insulating coating 204 and a second internal conductor 202 are twisted together.

FIG. 11 is a view showing a sensor circuit 24 using the sensor electric wire 13 shown in FIG. 10.

FIGS. 12(A) to (E) are views showing an example in which an insulating member and a conductor member are applied to an end of the sensor electric wire 13 which is not connected to the circuit.

FIG. 13 is a cross-sectional view showing a modified example of the second embodiment.

FIG. 14 is a view showing a sensor circuit 25 using a sensor electric wire 14 shown in FIG. 13.

FIG. 15 is a cross-sectional view showing a modified example of the second embodiment.

FIG. 16 is a view showing an example of a sensor circuit using a sensor electric wire 15 shown in FIG. 15.

FIG. 17 is a cross-sectional view showing a modified example of the second embodiment.

FIG. 18 is a view showing an example of a sensor circuit using a sensor electric wire 16 shown in FIG. 17.

FIG. 19 is a view showing an example of a sensor circuit using the sensor electric wire 16 shown in FIG. 17.

FIG. 20 is a cross-sectional view showing a modified example of the second embodiment.

FIG. 21 is a view showing a sensor circuit 29 using a sensor electric wire 17 shown in FIG. 20.

FIG. 22 is a view showing a sensor circuit 30 in which a switch 301 is added to a part of the sensor circuit 20 shown in FIG. 3.

FIG. 23 is a view showing a sensor circuit 31 in which the switch 301 is added to a part of the sensor circuit 24 shown in FIG. 11.

FIG. 24 is a view showing a sensor circuit 32 in which a differential amplifier 151 that amplifies and then outputs a potential difference between an external shield conductor 103 and the second internal conductor 102 is added to the sensor circuit 20 shown in FIG. 3.

FIG. 25 is a view showing a sensor circuit 33 in which a differential amplifier 251 that amplifies and then outputs a potential difference between an external shield conductor 203 and the second internal conductor 202 is added to the sensor circuit 24 shown in FIG. 11.

DESCRIPTION OF EMBODIMENTS

A sensor electric wire of the invention is a sensor in a shape of an electric wire. Hereinafter, embodiments of the sensor electric wire will be described.

[Sensor Electric Wire of First Embodiment]

FIG. 1(A) is a cross-sectional view showing a structure of the sensor electric wire 10 according to a first embodiment of the invention. The sensor electric wire 10 includes the first internal conductor 101 provided at a center, the second internal conductor 102 provided on an external side of the first internal conductor 101, and the external shield conductor 103 provided further on an external side of the second internal conductor 102. The first insulating coating 104 is provided between the first internal conductor 101 and the second internal conductor 102. That is, the first internal conductor 101 is covered with the first insulating coating 104, and thus is insulated from the second internal conductor 102 and the external shield conductor 103. A second insulating coating 105 is provided between the second internal conductor 102 and the external shield conductor 103. That is, the second internal conductor 102 is covered with the second insulating coating 105, and thus is insulated from the external shield conductor 103. A sheath 130 is provided on an external side of the external shield conductor 103.

In FIG. 1(A), the first internal conductor 101 is shown by a hatching formed by diagonal lines orthogonal to each other, and the second internal conductor 102 and the external shield conductor 103 are shown by hatchings formed by horizontal lines. The first insulating coating 104 is shown by a hatching formed by right-downward sloping lines, and the second insulating coating 105 is shown by a hatching formed by left-downward sloping lines.

As shown in FIG. 1(B), the first internal conductor 101 is constituted by seven twisted conductor wires 1000. Although not shown, the conductor wire 1000 shown in FIG. 1(B) is also constituted by seven twisted internal conductor wires (thickness 10 μm in the embodiment). That is, the first internal conductor 101 is constituted by 49 conductor wires twisted in two stages.

A configuration of the first internal conductor 101 is not limited to a configuration of the embodiment, in which the number of stages to be twisted may be different; the number of conductor wires to be twisted may be different; and thickness of the conductor wires to be twisted may be different. During twisting, the conductor wires twisted in different directions may be combined, or twisting directions may be different depending on twisting stages. The first internal conductor 101 may be constituted by one conductor wire. In the embodiment, these conductor wires are made of copper, but a material thereof is not particularly limited and may be, for example, stainless steel, tungsten, titanium, magnesium, or an alloy thereof, and may be a combination of conductor wires made of a plurality of types of different materials.

The second internal conductor 102 and the external shield conductor 103 are both constituted by a combination of an aluminum film and a copper mesh, but these conductors are not limited to this configuration. For example, a metal film, a metal mesh, a metal wire wound in a spiral shape, or a combination thereof may be used. Configurations and materials of the second internal conductor 102 and the external shield conductor 103 do not have to be the same, and may be different. For example, the external shield conductor 103 may have a plurality of layers, such as a two-layer configuration consisting of a layer of a metal mesh and a layer of a PET film to which a metal foil is attached.

The first insulating coating 104 is formed by a PVDF (polyvinylidene fluoride) film which is a piezoelectric material, and is spirally wound around the first internal conductor 101 as shown in FIG. 2. The first insulating coating 104 has piezoelectricity by being subjected to a polarization treatment.

FIG. 2 shows an example, in which the first insulating coating 104 is constituted by two piezoelectric films, but the number of the used piezoelectric film is not limited to two, and for example, the number may be one or more than two. When the piezoelectric film is wound around the first internal conductor 101, it is preferable that no gap is formed so that noise is less likely to have an influence on the first internal conductor 101. Therefore, in the first insulating coating 104 of the embodiment, as shown in FIG. 2, by winding the two strip-shaped piezoelectric films towards the same direction while shifting the two piezoelectric films by 180 degrees, tension of the piezoelectric films is equalized around the first internal conductor 101 to prevent gaps from being generated due to bias of the films. When the first internal conductor 101 is formed by twisting the conductor wires 1000 as shown in FIG. 1(A), the piezoelectric films may be wound in the same direction as or in a direction opposite to a twisting direction of the first internal conductor 101. Depending on this direction, flexibility of the sensor electric wire 10 may be changed.

Although PVDF is used in the embodiment, the first insulating coating 104 may be constituted by a material having piezoelectricity, such as trifluoroethylene (TrEF), a mixed crystal material of PVDF and TrEF, or a polymer material having a dipole moment such as polylactic acid, polyuric acid, and polyamino acid. The first insulating coating 104 is not limited to a configuration using a film made of a piezoelectric material such as a PVDF film, and may be coated with a piezoelectric material. Such a coating method may be a dip (dove) coating, a spray coating by a spray or the like, an impregnation coating, a brush coating, or a coating with a coating device such as a coater.

The second insulating coating 105 is a coating of an insulator resin (for example, vinyl chloride, polyethylene), and does not have piezoelectricity as the first insulating coating 104 does.

Next, a usage example of the sensor electric wire 10 described above will be described with reference to FIG. 3. FIG. 3 is a view showing the sensor circuit 20 using the sensor electric wire 10 shown in FIG. 1. In the sensor circuit 20, the first internal conductor 101 and the second internal conductor 102 are connected to a differential amplifier 150, and the external shield conductor 103 is connected to a ground. The differential amplifier 150 amplifies and then outputs a potential difference between the first internal conductor 101 and the second internal conductor 102.

When an external force is applied to the sensor electric wire 10 in the sensor circuit 20, the first insulating coating 104 having piezoelectricity is deformed, and the potential difference between the first internal conductor 101 and the second internal conductor 102 fluctuates due to a piezoelectric effect thereof. The potential difference is amplified and then output by the differential amplifier 150. That is, the sensor circuit 20 has a function as a sensor that outputs a signal based on the external force applied to the sensor electric wire 10.

The sensor circuit 20 is also configured to prevent an influence of external noise on the signal based on the external force. First, the first internal conductor 101 and the second internal conductor 102 are surrounded by the external shield conductor 103 connected to the ground so that the potential is less likely to fluctuate due to the external noise. Furthermore, even if the external noise passes through the external shield conductor 103, both the first internal conductor 101 and the second internal conductor 102 inside are affected by the noise and similar potential fluctuations occur between these internal conductors. The sensor circuit 20 is configured to offset the potential fluctuation due to the influence of the external noise by amplifying the potential difference between the first internal conductor 101 and the second internal conductor 102.

As described above, in the sensor circuit 20, when an external force is applied to the sensor electric wire 10, a potential difference occurs between the first internal conductor 101 and the second internal conductor 102, while the potential difference between the first internal conductor 101 and the second internal conductor 102 due to the influence of the external noise can be prevented. By this configuration, it is possible to obtain a signal based on the external force while preventing the influence of the external noise.

A ground potential may fluctuate depending on a grounding condition of the external shield conductor 103, but in the sensor circuit 20 described above, the potential difference between the first internal conductor 101 and the second internal conductor 102 is used instead of the potential difference from the ground, and therefore, influence of fluctuations in the ground potential can be prevented.

When the sensor electric wire 10 is used and the first internal conductor 101, the second internal conductor 102, and the external shield conductor 103 are exposed at an end of the sensor electric wire 10 which is not connected to the circuit, the conductors may come into contact with each other and thus the signal based on the external force may not be obtained accurately. Therefore, it is preferable to ensure insulation of the first internal conductor 101, the second internal conductor 102, and the external shield conductor 103 at the end which is not connected to the circuit. When there is a part where the first internal conductor 101 and the second internal conductor 102 are not covered by the external shield conductor 103 at the end which is not connected to the circuit, the part may be affected by the external noise. Therefore, it is preferable to reliably shield the first internal conductor 101 and the second internal conductor 102 at the end which is not connected to the circuit.

FIG. 4 is a view showing an example in which insulating members and conductor members are applied to the end of the sensor electric wire 10 which is not connected to the circuit. In this view, insulating members 171 and 173, conductor members 172 and 174, and a cover member 175 are applied to the end, and FIGS. 4(A) to 4(F) are shown in stages so that each stage is easy to understand.

FIG. 4(A) shows the end where the first internal conductor 101, the second internal conductor 102, and the external shield conductor 103 are exposed. FIG. 4(B) shows a state in which the first internal conductor 101 shown in FIG. 4(A) is covered with the insulating member 171 up to the first insulating coating 104. In this example, the insulating member 171 covers up to the first insulating coating 104, and the first internal conductor 101 can be reliably insulated from other conductors without being exposed.

FIG. 4(C) shows a state in which the insulating member 171 is covered with the conductor member 172 up to the second internal conductor 102 from the state shown in FIG. 4(B). In this example, potentials of the second internal conductor 102 and the conductor member 172 are the same. By the conductor member 172, the first internal conductor 101 can be made less susceptible to the external noise.

FIG. 4(D) shows a state in which the conductor member 172 is covered with the insulating member 173 up to the second insulating coating 105 from the state shown in FIG. 4(C). In this example, the insulating member 173 covers up to the second insulating coating 105, and the second internal conductor 102 can be reliably insulated from other conductors without being exposed.

FIG. 4(E) shows a state in which the insulating member 173 is covered with the conductor member 174 up to the external shield conductor 103 from the state shown in FIG. 4(D). In this example, potentials of the external shield conductor 103 and the conductor member 174 are the same. The conductor member 174 shields the first internal conductor 101 and the second internal conductor 102 to be less susceptible to the external noise.

FIG. 4(F) shows a state in which the conductor member 174 is covered with the cover member 175 (the same material as the sheath 130) up to the sheath 130 from the state shown in FIG. 4(E). In this example, the end where the insulating members 171 and 173 and the conductor members 172 and 174 are provided can be protected. The cover member 175 may be made of a material that is heat-shrinkable (or heat-sealed), and may be brought into close contact with the end by heating while covering the end.

The insulating members 171 and 173 described in the above example may be made of an insulating material (for example, vinyl chloride, polyethylene). The conductor members 172 and 174 may be made of a conductive material (for example, aluminum, copper, tin, an alloy made of a plurality of materials). Shapes of the conductor members 172 and 174 may be a film shape, a mesh shape, or a tubular rod terminal, and the shapes thereof are not limited.

The insulating members 171 and 173, the conductor members 172 and 174, and the cover member 175 described in the above example do not all have to be applied, and for example, the cover member 175 may be used only or the conductor member 172 may be excluded. There may also be other configurations not limited to the above example. For example, when the end excluding the sheath 130 is flat, the end excluding the sheath 130 may be covered with an insulating member, and then be covered with a conductor member to be in contact with the external shield conductor 103, and further be provided with a cover member. The first internal conductor 101, the first insulating coating 104, the second internal conductor 102, and the second insulating coating 105 may be cut to be shorter than the external shield conductor 103, be wrapped by the external shield conductor 103 after being insulated, and further be provided with a cover member. That is, the configuration is not limited as long as insulation and shielding between the conductors are reliable.

Modified Example 1 of First Embodiment

The sensor electric wire 10 shown in FIG. 1 has a configuration in which one first internal conductor 101 covered with the first insulating coating 104 is provided, but a plurality of first internal conductors 101 covered with the first insulating coating 104 may be provided. FIG. 5 is a cross-sectional view showing a structure of the sensor electric wire 11 including two first internal conductors 101 covered with the first insulating coating 104. In the sensor electric wire 11, a plurality of (here, two) cores are formed by first internal conductors 101A and 101B, and a signal based on an external force is output from each of these cores. In this cross-sectional view, there are gaps between first insulating coatings 104A and 104B and the second internal conductor 102, and the gaps are filled with inclusions. When the plurality of first internal conductors 101 covered with the first insulating coating 104 are provided, the first internal conductors may be twisted together in order to prevent an influence of the external noise. For example, thicknesses or materials of the first insulating coatings 104A and 104B are made different so that fluctuation of a potential (sensor sensitivity) according to an external force is different for each first internal conductor 101. The second internal conductor 102 may have the same configuration as the sensor electric wire 10 shown in FIG. 1, or may have a configuration using inclusions made of a conductive material.

FIGS. 6 and 7 are views showing examples of sensor circuits using the sensor electric wire 11 shown in FIG. 5. A sensor circuit 21 shown in FIG. 6 adopts a configuration in which outputs of the plurality of first internal conductors 101A and 101B are combined and then amplified so that sensitivity thereof to an external force can be increased. Meanwhile, a sensor circuit 22 shown in FIG. 7 has a configuration in which a plurality of signals are output by amplifying a potential difference between each of the plurality of first internal conductors 101A and 101B and the second internal conductor 102. When the fluctuation of the potential (sensor sensitivity) according to the external force is different for each of the first internal conductors 101A and 101B in a case where the configuration of the sensor circuit 22 shown in FIG. 7 is adopted, an appropriate signal according to the external force can be used, and a dynamic range can be widened.

Modified Example 2 of First Embodiment

The sensor electric wire 11 shown in FIG. 5 includes the plurality of first internal conductors 101 covered with the first insulating coating 104, and the first internal conductors are covered together with the second internal conductor 102. However, the second internal conductor 102 may be provided for each of the first internal conductors 101 covered with the first insulating coating 104. FIG. 8 is a cross-sectional view showing a structure of a sensor electric wire 12 including two combinations of the first insulating coating 104 covering the first internal conductor 101 and the second internal conductor 102 further covering an external side of the first insulating coating 104. In the sensor electric wire 12, a plurality of cores are constituted by the first internal conductors 101A and 101B, and a signal based on an external force is output from each of the cores. When the plurality of first internal conductors 101 covered with the first insulating coating 104 are provided, the combinations may be twisted together so that an influence of an external noise can be reduced, and thicknesses or materials of the first insulating coatings 104A and 104B may be made different, which is the same as the sensor electric wire 11 in FIG. 5. Furthermore, when a sensor circuit is constituted by the sensor electric wire 12, the sensor circuit may have a configuration as the sensor circuit 21 shown in FIG. 6, in which outputs of the plurality of first internal conductors 101A and 101B are combined to amplify a potential difference with the second internal conductor 102 (either or both of 102A and 102B), or have a configuration as the sensor circuit 22 shown in FIG. 7, in which a plurality of signals are output by amplifying a potential difference between each of the plurality of first internal conductors 101A and 101B and the second internal conductor 102 (either or both of 102A and 102B).

FIG. 9 is a view showing an example of a sensor circuit using the sensor electric wire 12 shown in FIG. 8. In the sensor electric wire 12, the first internal conductor 101A and the second internal conductor 102A belong to one core, and the first internal conductor 101B and the second internal conductor 102B belong to another core. Here, thicknesses of the first insulating coatings 104A and 104B provided on the cores may vary during manufacturing, and thus a change amount in a potential according to an external force of a part may differ from that of other parts. Therefore, a sensor circuit 23 shown in FIG. 9 adopts a configuration that amplifies a potential difference between internal conductors belonging to different cores, not a potential difference between internal conductors belonging to the same core. Specifically, a configuration is adopted in which a potential difference between the first internal conductor 101A and the second internal conductor 102B and a potential difference between the first internal conductor 101B and the second internal conductor 102A are amplified separately, and a potential difference between these outputs is amplified. In this configuration, the output can be averaged and stabilized even if the change amount in the potential according to the external force varies.

[Sensor Electric Wire of Second Embodiment]

FIG. 10(A) is a cross-sectional view showing a structure of the sensor electric wire 13 according to a second embodiment of the invention.

The sensor electric wire 13 includes the first internal conductor 201 covered with a first insulating coating 204, the second internal conductor 202, a second insulating coating 205 covering the first insulating coating 204 and the second internal conductor 202, and the external shield conductor 203 covering an external side of the second insulating coating 205. The first internal conductor 201, the second internal conductor 202, and the external shield conductor 203 are insulated from each other. A sheath 230 is provided on an external side of the external shield conductor 203. In this cross-sectional view, there is a gap among the first insulating coating 204, the second internal conductor 202, and the second insulating coating 205, and the gap is filled with inclusions. In the first embodiment described above, the second internal conductor 102 does not form a core different from that of the first internal conductor 101, which is different from the second embodiment in which the second internal conductor 202 forms a core different from that of the first internal conductor 201. The first internal conductor 201 covered with the first insulating coating 204 and the second internal conductor 202 are twisted together to reduce an influence of an external noise as shown in FIG. 10(B).

In FIG. 10, the first internal conductor 201 and the second internal conductor 202 are shown by hatchings formed by diagonal lines orthogonal to each other, and the external shield conductor 203 is shown by a hatching formed by horizontal lines. The first insulating coating 204 is shown by a hatching formed by right-downward sloping lines, and the second insulating coating 205 is shown by a hatching formed by left-downward sloping lines.

The first internal conductor 201 and the second internal conductor 202 have the same configuration as the first internal conductor 101 in the first embodiment, and a material thereof may be the same as that of the first internal conductor 101 in the first embodiment. Configurations and materials of the first internal conductor 201 and the second internal conductor 202 do not have to be the same, and may be different.

The external shield conductor 203 is constituted by a combination of an aluminum film and a copper mesh, but is not limited to this configuration. For example, a metal film, a metal mesh, a metal wire wound in a spiral shape, or a combination thereof may be used. The external shield conductor 203 may have a plurality of layers, such as a two-layer configuration consisting of a layer of a metal mesh and a layer of a PET film to which a metal foil is attached.

The first insulating coating 204 is formed using a PVDF (polyvinylidene fluoride) film which is the same piezoelectric material as the first insulating coating 104 in the first embodiment, and is spirally wound around the first internal conductor 201 in the same way as the first insulating coating 104 in the first embodiment shown in FIG. 2. The first insulating coating 204 has piezoelectricity by being subjected to a polarization treatment. The first insulating coating 204 may have the same material and configuration as those of the first insulating coating 104 in the first embodiment.

The second insulating coating 205 is a coating of an insulator resin (for example, vinyl chloride, polyethylene), and does not have piezoelectricity as the first insulating coating 204 does.

Next, a usage example of the sensor electric wire 13 shown in FIG. 10 will be described with reference to FIG. 11. FIG. 11 is a view showing the sensor circuit 24 using the sensor electric wire 13 shown in FIG. 10. In the sensor circuit 24, the first internal conductor 201 and the second internal conductor 202 are connected to a differential amplifier 250, and the external shield conductor 203 is connected to a ground. The differential amplifier 250 amplifies and then outputs a potential difference between the first internal conductor 201 and the second internal conductor 202.

When an external force is applied to the sensor electric wire 13 in the sensor circuit 24, the first insulating coating 204 having piezoelectricity is deformed, and the potential difference between the first internal conductor 201 and the second internal conductor 202 fluctuates due to a piezoelectric effect thereof. The potential difference is amplified and then output by the differential amplifier 250. That is, the sensor circuit 24 has a function as a sensor that outputs a signal based on the external force applied to the sensor electric wire 13.

The sensor circuit 24 is also configured to prevent an influence of external noise on the signal based on the external force. First, the first internal conductor 201 and the second internal conductor 202 are surrounded by the external shield conductor 203 connected to the ground so that the potential is less likely to fluctuate due to the external noise. Furthermore, even if the external noise passes through the external shield conductor 203, both the first internal conductor 201 and the second internal conductor 202 inside are affected by the noise and similar potential fluctuations occur between these internal conductors. The sensor circuit 24 is configured to offset the potential fluctuation due to the influence of the external noise by amplifying the potential difference between the first internal conductor 201 and the second internal conductor 202.

As described above, in the sensor circuit 24, when an external force is applied to the sensor electric wire 13, a potential difference occurs between the first internal conductor 201 and the second internal conductor 202, while the potential difference between the first internal conductor 201 and the second internal conductor 202 due to the influence of the external noise can be prevented. By this configuration, it is possible to obtain a signal based on the external force while preventing the influence of the external noise.

A ground potential may fluctuate depending on a grounding condition of the external shield conductor 203, but in the sensor circuit 24 described above, the potential difference between the first internal conductor 201 and the second internal conductor 202 is used instead of the potential difference from the ground, and therefore, influence of fluctuations in the ground potential can be prevented.

When the sensor electric wire 13 is used and the first internal conductor 201, the second internal conductor 202, and the external shield conductor 203 are exposed at an end of the sensor electric wire 13 which is not connected to the circuit, the conductors may come into contact with each other and thus the signal based on the external force may not be obtained accurately. Therefore, it is preferable to ensure insulation of the first internal conductor 201, the second internal conductor 202, and the external shield conductor 203 at the end which is not connected to the circuit. When there is a part where the first internal conductor 201 and the second internal conductor 202 are not covered by the external shield conductor 203 at the end which is not connected to the circuit, the part may be affected by the external noise. Therefore, it is preferable to reliably shield the first internal conductor 201 and the second internal conductor 202 at the end which is not connected to the circuit.

FIG. 12 is a view showing an example in which insulating members and a conductor member are applied to the end of the sensor electric wire 10 which is not connected to the circuit. In this view, insulating members 271 and 273, a conductor member 274, and a cover member 275 are applied to the end, and FIGS. 12(A) to 12(E) are shown in stages so that each stage is easy to understand.

FIG. 12(A) shows the end where the first internal conductor 201, the second internal conductor 202, and the external shield conductor 203 are exposed. FIG. 12(B) shows a state in which the first internal conductor 201 shown in FIG. 12(A) is covered with the insulating member 271 up to the first insulating coating 204. In this example, the insulating member 271 covers up to the first insulating coating 204, and the first internal conductor 201 can be reliably insulated from other conductors without being exposed.

FIG. 12(C) shows a state in which the insulating member 271 and the second internal conductor 202 are covered with the insulating member 273 up to the second insulating coating 205 from the state shown in FIG. 12(B). In this example, the insulating member 273 covers up to the second insulating coating 205, and the second internal conductor 202 can be reliably insulated from other conductors without being exposed.

FIG. 12(D) shows a state in which the insulating member 273 is covered with the conductor member 274 up to the external shield conductor 203 from the state shown in FIG. 12(C). In this example, potentials of the external shield conductor 203 and the conductor member 274 are the same. The conductor member 274 shields the first internal conductor 201 and the second internal conductor 202 to be less susceptible to the external noise.

FIG. 12(E) shows a state in which the conductor member 274 is covered with the cover member 275 (the same material as the sheath 230) up to the sheath 230 from the state shown in FIG. 12(D). In this example, the end where the insulating members 271 and 273 and the conductor member 274 are provided can be protected. The cover member 275 may be made of a material that is heat-shrinkable (or heat-sealed), and may be brought into close contact with the end by heating while covering the end.

The insulating members 271 and 273 described in the above example may be made of an insulating material (for example, vinyl chloride, polyethylene). The conductor member 274 may be made of a conductive material (for example, aluminum, copper, tin, an alloy made of a plurality of materials). A shape of the conductor member 274 may be a film shape, a mesh shape, or a tubular rod terminal, and the shape thereof is not limited.

The insulating members 271 and 273, the conductor member 274, and the cover member 275 described in the above example do not have to have the same configuration, and for example, the cover member 275 may be used only, or an insulating member that insulates only the conductor member 272 from other conductors may be used. There may also be other configurations not limited to the above example. For example, when the end excluding the sheath 230 is flat, the end excluding the sheath 230 may be covered with an insulating member, and then be covered with a conductor member to be in contact with the external shield conductor 203, and further be provided with a cover member. The first internal conductor 201, the first insulating coating 204, the second internal conductor 202, and the second insulating coating 205 may be cut to be shorter than the external shield conductor 203, be wrapped by the external shield conductor 203 after being insulated, and further be provided with a cover member. That is, the configuration is not limited as long as insulation and shielding between the conductors are reliable.

Modified Example 1 of Second Embodiment

The sensor electric wire 13 shown in FIG. 10 adopts the configuration in which the first internal conductor 201 covered with the first insulating coating 204 and the second internal conductor 202 are covered with the second insulating coating 205, but the sensor electric wire is not limited to this configuration. For example, there may be a configuration in which the first internal conductor 201 covered with the first insulating coating 204 and the second internal conductor 202 covered with the second insulating coating 205 are provided, and the external shield conductor 203 is provided further outside. FIG. 13 is a cross-sectional view showing a structure of the sensor electric wire 14 adopting this configuration. The sensor electric wire 14 includes the first internal conductor 201 covered with the first insulating coating 204, the second internal conductor 202 covered with the second insulating coating 205, and the external shield conductor 203 provided further outside. The first internal conductor 201, the second internal conductor 202, and the external shield conductor 203 are insulated from each other. The sheath 230 is further provided on an external side of the external shield conductor 203. A position where the second insulating coating 205 is provided is different from that of the sensor electric wire 13 in FIG. 10. In this cross-sectional view, there is a gap among the first insulating coating 204, the second insulating coating 205, and the external shield conductor 203, and the gap is filled with inclusions. In the sensor electric wire 13 shown in FIG. 10, the first internal conductor 201 covered with the first insulating coating 204 and the second internal conductor 202 are twisted to reduce the influence of the external noise, whereas in the sensor electric wire 14, the first internal conductor 201 covered with the first insulating coating 204 and the second internal conductor 202 covered with the second insulating coating 205 are twisted together.

The second insulating coating 205 is a coating having the same material and composition as the first insulating coating 204 and does not have piezoelectricity. That is, the second insulating coating 205 is different from the first insulating coating 204 in presence or absence of the piezoelectricity. The material of the second insulating coating 205 is not limited to the same material as the first insulating coating 204, and may use a material different from that of the first insulating coating 204 such as an insulator resin (for example, vinyl chloride, polyethylene).

FIG. 14 is a view showing the sensor circuit 25 using the sensor electric wire 14 shown in FIG. 13. The sensor circuit 25 has the same configuration as the sensor circuit 24 shown in FIG. 11 except for the position where the second insulating coating 205 is provided. When an external force is applied to the sensor electric wire 14 in the sensor circuit 25, the first insulating coating 204 having piezoelectricity is deformed, and a potential of the first internal conductor 201 fluctuates due to a piezoelectric effect thereof. However, since the second insulating coating 205 does not have piezoelectricity, a potential of the second internal conductor 202 does not fluctuate according to the external force. Therefore, when an external force is applied to the sensor electric wire 14, a potential difference between the first internal conductor 201 and the second internal conductor 202 fluctuates, and this a potential difference is amplified and then output by the differential amplifier 250. That is, the sensor circuit 25 has a function as a sensor that outputs a signal based on the external force applied to the sensor electric wire 14.

The sensor circuit 25 is also configured to reduce an influence of external noise on the signal based on the external force. First, the first internal conductor 201 and the second internal conductor 202 are surrounded by the external shield conductor 203 connected to the ground so that the potential is less likely to fluctuate due to the external noise. Furthermore, even if the external noise passes through the external shield conductor 203, both the first internal conductor 201 and the second internal conductor 202 inside are affected by the noise and similar potential fluctuations occur between these internal conductors. The sensor circuit 25 is configured to offset the potential fluctuation due to the influence of the external noise by amplifying the potential difference between the first internal conductor 201 and the second internal conductor 202. In order to effectively offset the fluctuation of the potential due to the influence of the external noise, it is preferable that electrical and physical conditions, such as length and thickness, capacitance (dielectric constant and thickness of the insulation coatings), impedance, and degree of shielding, of the first internal conductor 201 covered with the first insulating coating 204 and the second internal conductor 202 covered with the second insulating coating 205 are met.

As described above, in the sensor circuit 25, when an external force is applied to the sensor electric wire 14, a potential difference between the first internal conductor 201 and the second internal conductor 202 occurs, while the potential difference between the first internal conductor 201 and the second internal conductor 202 due to the influence of the external noise can be prevented. By this configuration, it is possible to obtain a signal based on the external force while preventing the influence of the external noise.

A ground potential may fluctuate depending on a grounding condition of the external shield conductor 203, but in the sensor circuit 25 described above, the potential difference between the first internal conductor 201 and the second internal conductor 202 is used instead of the potential difference from the ground, and therefore, influence of fluctuations in the ground potential can be prevented.

Modified Example 2 of Second Embodiment

The sensor electric wire 14 shown in FIG. 13 has a configuration in which both the first internal conductor 201 covered with the first insulating coating 204 and the second internal conductor 202 covered with the second insulating coating 205 are housed in a space partitioned by the external shield conductor 203. However, the configuration of the sensor electric wire is not limited to this, and the first internal conductor 201 covered with the first insulation coating 204 and the second internal conductor 202 covered with the second insulation coating 205 may be housed in separate spaces partitioned by the external shield conductor 203. The sensor electric wire 15 shown in FIG. 15 is an example of such a configuration, in which the first internal conductor 201 covered with the first insulating coating 204 and the second internal conductor covered with the second insulating coating 205 are respectively covered with different external shield conductors 203A and 203B. A combination of the external shield conductor 203A and the first internal conductor 201 covered with the first insulation coating 204 may be twisted together with a combination of the external shield conductor 203B and the second internal conductor 202 covered with the second insulation coating 205 to reduce the influence of the external noise.

FIG. 16 is a view showing an example of a sensor circuit using the sensor electric wire 15 shown in FIG. 15. A sensor circuit 26 shown in FIG. 16 has the same configuration as the sensor circuit 25 shown in FIG. 14 except that the two external shield conductors 203A and 203B are connected to the ground separately, and has the same effect as the sensor circuit 25 shown in FIG. 14. In the sensor electric wire 15 shown in FIG. 15, since the two external shield conductors 203A and 203B are in contact with each other, anyone thereof may be connected to the ground. The two external shield conductors 203A and 203B may be insulated from each other, and in this case, as shown in FIG. 16, both external shield conductors 203 may be connected to the ground.

Modified Example 3 of Second Embodiment

The sensor electric wire 13 shown in FIG. 10 and the sensor electric wire 14 shown in FIG. 13 both have one first internal conductor 201 covered with the first insulating coating 204, but a plurality of first internal conductors 201 covered with the first insulating coating 204 may be provided. FIG. 17 is an example of such a configuration, and is a cross-sectional view showing a structure of the sensor electric wire 16 provided with two first internal conductors 201 covered with the first insulating coating 204. In the sensor electric wire 16, signals based on an external force are output from the first internal conductors 201A and 201B. In this cross-sectional view, there is a gap among the first insulating coatings 204A and 204B, the second insulating coating 205, and the external shield conductor 203, and the gap is filled with inclusions. When the plurality of first internal conductors 201 covered with the first insulating coating 204 are provided, the first internal conductors may be twisted together, or may be twisted with the second internal conductor 202 covered with the second insulating coating 205, so as to reduce the influence of the external noise. For example, the thicknesses or the materials of the first insulating coatings 204A and 204B may be made different so that the fluctuation of the potential (sensor sensitivity) according to the external force is different for each of the first internal conductors 201. In the sensor electric wire 16 shown in FIG. 17, the first internal conductors 201 covered with the corresponding first insulating coatings 204 and the second internal conductor 202 covered with the second insulating coating 205 are both housed in one space partitioned by the external shield conductor 203. However, as described in the example shown in FIG. 15, the internal conductors may be respectively housed in different spaces partitioned by the external shield conductor 203.

FIGS. 18 and 19 are views showing examples of sensor circuits using the sensor electric wire 16 shown in FIG. 17. A sensor circuit 27 shown in FIG. 18 adopts a configuration in which outputs of the plurality of first internal conductors 201A and 201B are combined and then amplified, so that sensitivity thereof to an external force can be increased. Meanwhile, a sensor circuit 28 shown in FIG. 19 has a configuration in which a plurality of signals are output by amplifying a potential difference between each of the plurality of first internal conductors 201A and 201B and the second internal conductor 102. When the fluctuation of the potential (sensor sensitivity) according to the external force is different for each of the first internal conductors 201A and 201B in a case where the configuration of the sensor circuit 28 shown in FIG. 19 is adopted, an appropriate signal according to the external force can be used, and a dynamic range can be widened.

Modified Example 4 of Second Embodiment

In the description of the sensor electric wire 14 shown in FIG. 13, it has been described that it is preferable that the electrical and physical conditions, such as the length and thickness, capacitance, impedance, and degree of shielding, of the first internal conductor 201 covered with the first insulating coating 204 and the second internal conductor 202 covered with the second insulating coating 205 are met. When adopting a set of such electrical and physical conditions, the invention is not limited to one set and a plurality of sets may be adopted. In this case, the fluctuation of the potential (sensor sensitivity) of the first internal conductor 201 generated according to the external force may be the same or different in each set.

The sensor electric wire 17 shown in FIG. 20 is a cross-sectional view showing an example in which two sets of the first internal conductor 201 and the second internal conductor 202 are provided. In FIG. 20, the first internal conductors 201 covered with the first insulating coating 204 are arranged on a left side and an upper side separately, and second internal conductors 202 covered with the second insulating coating 205 are arranged on a right side and a lower side separately. The first insulating coatings 204 covering the two first internal conductors 201 have different thicknesses. Specifically, the first insulating coating 204B located on the upper side is thicker than the first insulating coating 204A located on the left side of FIG. 20. Therefore, the first internal conductor 201B located on the upper side has a higher potential fluctuation (sensor sensitivity) according to the external force than the first internal conductor 201A located on the left side. In this cross-sectional view, there is a gap between the first insulating coatings 204A and 204B, the second insulating coatings 205A and 205B, and the external shield conductor 203, and the gap is filled with inclusions.

When providing a plurality of first internal conductors 201 covered with the first insulating coating 204 and a plurality of second internal conductors 202 covered with the second insulating coating 205, the internal conductors may be twisted together in order to reduce the influence of the external noise. In this case, the internal conductors may be twisted in stages such as respectively twisting a first set and a second set described later and then twisting the first set and the second set together, and the twisting manner is not limited. In the sensor electric wire 17 shown in FIG. 20, the first internal conductors 201 covered with the first insulating coating 204 and the second internal conductors 202 covered with the second insulating coating 205 are all housed in one space partitioned by the external shield conductors 203. However, as described in the example shown in FIG. 15, the internal conductors may be respectively housed in different spaces partitioned by the external shield conductor 203.

Of the two second internal conductors 202, the second internal conductor 202A on the right side is provided to cancel the influence of the external noise on the first internal conductor 201A on the left side. The first internal conductor 201A and the second internal conductor 202A have the same configuration. The first insulating coating 204A is different from the second insulating coating 205A in that the first insulating coating 204A has piezoelectricity (subjected to a polarization treatment), whereas the second insulating coating 205A does not have piezoelectricity (not subjected to the polarization treatment), but materials and thicknesses thereof are the same. That is, the first internal conductor 201A covered with the first insulating coating 204A and the second internal conductor 202A covered with the second insulating coating 205A have the same electrical and physical conditions except for the presence or absence of piezoelectricity. In the following description, a set of the first internal conductor 201A covered with the first insulating coating 204A and the second internal conductor 202A covered with the second insulating coating 205A is referred to as the first set.

Of the two second internal conductors 202, the second internal conductor 202B on the lower side is provided to cancel the influence of the external noise on the first internal conductor 201B on the upper side. The first internal conductor 201B and the second internal conductor 202B have the same configuration. The first insulating coating 204B is different from the second insulating coating 205B in that the first insulating coating 204B has piezoelectricity (subjected to a polarization treatment), whereas the second insulating coating 205B does not have piezoelectricity (not subjected to the polarization treatment), but materials and thicknesses thereof are the same. That is, the first internal conductor 201B covered with the first insulating coating 204B and the second internal conductor 202B covered with the second insulating coating 205B have the same electrical and physical conditions except for the presence or absence of piezoelectricity. In the following description, a set of the first internal conductor 201B covered with the first insulating coating 204B and the second internal conductor 202B covered with the second insulating coating 205B is referred to as the second set.

FIG. 21 is a view showing the sensor circuit 29 using the sensor electric wire 17 shown in FIG. 20. In the sensor circuit 29, the first internal conductors 201A and the second internal conductor 202A of the first set are connected to the differential amplifier 250; the first internal conductor 201B and the second internal conductor 202B of the second set are connected to the differential amplifier 250; and the external shield conductor 203 is connected to the ground. The differential amplifier 250 amplifies and then outputs potential differences between the first internal conductors 201 and the second internal conductors 202 of the first set and the second set. In the sensor circuit 29, an appropriate signal according to the external force can be used, and a large dynamic range can be obtained.

[Configuration 1 of Noise Sensor]

The first embodiment, the second embodiment, and the sensor circuits 20 to 29 in the modified examples cannot be effectively utilized in a state where no external force is applied to the sensor electric wires. For example, when considering applications such as applying these sensor circuits to a bed or a pillow to monitor a condition of a sleeping patient, the sensor circuit cannot be effectively utilized when the patient is away from the bed since no external force is applied to the sensor electric wire. Accordingly, by switching the connection to the differential amplifier in the above sensor circuits to a usage as a noise sensor, utilizing chances can be increased. In the above examples, since an external noise is detected when the patient approaches the bed, the external noise can be used as data of movement around the bed. This configuration will be described below.

In the first embodiment, the second embodiment, and the sensor circuits 20 to 29 in the modified examples, the first internal conductor 101 or 201 and the second internal conductor 102 or 202 are input to the differential amplifier 150 or 250, and the external shield conductor 103 or 203 is connected to the ground (FIGS. 3, 5, 6, 8, 10, 12, 14, 16, 17, and 19). The external shield conductor 103 or 203 surrounds the first internal conductor 101 or 201 and the second internal conductor 102 or 202, and is most affected by the external noise among these conductors. Therefore, in the sensor circuits 20 to 29, by switching one of the inputs to the differential amplifier 150 or 250 to the external shield conductor 103 or 203, the external noise can be reflected in an output of the differential amplifier 150 or 250, so that the sensor circuit can be used as a noise sensor. In this case, the other input to the differential amplifier 150 or 250 may be the same as above or may be connected to the ground.

The sensor circuit 30 shown in FIG. 22 is an example of the configuration described above, in which the switch 301 is added to a part of the sensor circuit 20 shown in FIG. 3. When the switch 301 is in an initial state (a state shown in FIG. 22), the sensor circuit 30 has the same configuration as the sensor circuit 20 shown in FIG. 3. When the switch 301 is switched, the external shield conductor 103 is connected to the differential amplifier 150 instead of the first internal conductor 101, so that the sensor circuit 30 can be used as a noise sensor.

The sensor circuit 31 shown in FIG. 23 is an example of the configuration described above, in which the switch 301 is added to a part of the sensor circuit 24 shown in FIG. 11. When the switch 301 is in an initial state (a state shown in FIG. 23), the sensor circuit 31 has the same configuration as the sensor circuit 24 shown in FIG. 11. When the switch 301 is switched, the external shield conductor 203 is connected to the differential amplifier 250 instead of the first internal conductor 201, so that the sensor circuit 31 can be used as a noise sensor.

Regarding the switch 301 in FIGS. 22 and 21, a sensor function may be implemented by switching the state of the switch 301 using, for example, a timer. The switch 301 may be switched according to a desired condition by using a microcomputer or the like.

[Configuration 2 of Noise Sensor]

The sensor circuit 30 shown in FIG. 22 and the sensor circuit 31 of FIG. 23 show a configuration of switching between a function as a sensor that outputs a signal based on an external force applied to the sensor electric wire and a function as a sensor that outputs a signal caused by noise by using the switch 301. The former function can be implemented by amplifying a potential difference between the first internal conductor 101 or 201 and the second internal conductor 102 or 202 by the differential amplifier 150 or 250. The latter function can be implemented by amplifying a potential difference between either of the first internal conductor 101 or 201 and the second internal conductor 102 or 202 and the external shield conductor 103 or 203 by the differential amplifier 150 or 250. Here, the sensor circuit may be configured to have both functions without switching these functions.

The sensor circuit 32 shown in FIG. 24 is an example of the configuration described above, in which the differential amplifier 151 that amplifies and then outputs the potential difference between the external shield conductor 103 and the second internal conductor 102 is added to the sensor circuit 20 shown in FIG. 3. In the sensor circuit 32, both the signal corresponding to the external force and the signal corresponding to the noise can be used at the same time.

The sensor circuit 33 shown in FIG. 25 is an example of the configuration described above, in which the differential amplifier 251 that amplifies and then outputs the potential difference between the external shield conductor 203 and the second internal conductor 202 is added to the sensor circuit 24 shown in FIG. 11. In the sensor circuit 33, both the signal corresponding to the external force and the signal corresponding to the noise can be used at the same time.

For example, in the sensor circuit 20 shown in FIG. 3 or the sensor circuit 24 shown in FIG. 11, when a signal according to the external force is affected by the external noise, it may not be possible to determine whether the signal is affected by the external force or not. In the sensor circuit 32 shown in FIG. 24 and the sensor circuit 33 shown in FIG. 25, a degree of influence of the external noise can be determined by outputs of the separately added differential amplifier 151 or 251 to determine whether the signal is affected by the external force or not.

[Others]

The configurations of the sensor electric wire and the sensor circuit described above are examples, and processing contents thereof may be the same, and the sensor electric wire and the sensor circuit are not limited to these configurations. For example, in the above embodiments of the sensor electric wire, twisting of the internal conductors is described, but when there are three or more objects to be twisted, the internal conductors may be twisted by braiding for example. When the conductors of the sensor electric wire are formed in the mesh shape, there is a problem that the noise may easily enter depending on a size of holes. In this case, it is possible to prevent the noise from entering by configuring the size of the holes to be half or less of a wavelength of the noise in question. In the above embodiments of the sensor circuit, one differential amplifier may be shared instead of using a plurality of differential amplifiers, or a notch filter or the like may be appropriately provided. In the above embodiments of the sensor circuit, the configuration in which the differential amplifier is connected to one end of the sensor electric wire is described, but both ends of the sensor electric wire may be connected to the same differential amplifier.

REFERENCE SIGNS LIST 10, 11, 12, 13, 14, 15, 16, 17 sensor electric wire
101, 201 first internal conductor
102, 202 second internal conductor
103, 203 external shield conductor
104, 204 first insulation coating
105, 205 second insulation coating
130, 230 sheath
171, 173, 271, 273 insulating member
172, 174, 274 conductor member
175, 275 cover member
20, 21, 22, 23, 24, 25, 26, 27, 28, 29 sensor circuit
30, 31, 32, 33 sensor circuit
150, 151, 250, 251 differential amplifier

The invention claimed is:

1. A sensor electric wire, comprising:
a first internal conductor, an external periphery of the first internal conductor being covered with a piezoelectric material;
a second internal conductor that covers an external periphery of the piezoelectric material;
an insulator covers an external periphery of the second internal conductor;
an external shield conductor that covers an external periphery of the insulator;
a sheath is provided to cover an external periphery of the sensor electric wire;
at one end of the sensor electric wire, a first end face shield conductor surrounding an end face of the first internal conductor and conducting with the second internal conductor;
at the one end of the sensor electric wire, a second end face shield conductor surrounding the first end face shield conductor and conducting with the external shield conductor; and
at the one end of the sensor electric wire, a cover member covering the second end face shield conductor and the sheath up to its end.

2. A sensor circuit, comprising:
the sensor electric wire according to claim 1,
wherein the external shield conductor is connected to a ground.

* * * * *